United States Patent [19]
Iwanaga et al.

[11] Patent Number: 6,150,692
[45] Date of Patent: Nov. 21, 2000

[54] THIN FILM SEMICONDUCTOR DEVICE FOR ACTIVE MATRIX PANEL

[75] Inventors: Toshihiko Iwanaga; Masumitsu Ino; Kikuo Kaise; Takenobu Urazono; Hiroyuki Ikeda, all of Kanagawa, Japan

[73] Assignee: Sony Corporation, Tokyo, Japan

[21] Appl. No.: 08/274,475

[22] Filed: Jul. 13, 1994

[30] Foreign Application Priority Data

Jul. 13, 1993 [JP] Japan ...................................... 5-195511
Sep. 14, 1993 [JP] Japan ...................................... 5-252624
Mar. 24, 1994 [JP] Japan ...................................... 6-079410

[51] Int. Cl.$^7$ .................................................. H01L 29/78
[52] U.S. Cl. ............................................................ 257/315
[58] Field of Search ............................................. 257/347

[56] References Cited

U.S. PATENT DOCUMENTS

| 4,883,766 | 11/1989 | Ishida et al. | |
|---|---|---|---|
| 4,906,587 | 3/1990 | Blake | 257/347 |
| 4,943,837 | 7/1990 | Konishi et al. | 257/347 |

OTHER PUBLICATIONS

Patent Abstracts of Japan, vol. 016, No. 354, (E–1242), Jul. 1992 & JP–A–04 111362 (Canon Inc.), Apr. 1992.
Patent Abstracts of Japan, vol. 14, No. 28, (E–875), Jan. 1990 & JP–A–01 265524 (Sony).
Patent Abstracts of Japan, vol. 016, No. 038, (E–1161), Jan. 1992 & JP–A–03 248434 (Seiko Epson Corp.), Nov. 1991.
Patent Abstracts of Japan, vol. 016, No. 381, (E–1248), Aug. 1992 & JP–A–04 122073 (Ricoh Co. Ltd.), Apr. 1992.
Patent Abstracts of Japan, vol. 016, No. 101, (E–1177), Mar. 1992, & JP–A–03 280435 (Seiko Epson Corp.) Dec. 1991.
Patent Abstracts of Japan, vol. 015, No. 405, (E–1122), Oct. 1991 & JP–A–03 165066 (TDK Corp.), Jul. 1991.
Patent Abstracts of Japan, vol. 012, No. 038, (E–580), Feb. 1988 & JP–A–62 190870 (Matsushita).

*Primary Examiner*—Stephen D. Meier
*Attorney, Agent, or Firm*—Hill & Simpson

[57] ABSTRACT

A thin film semiconductor device comprising a thin film transistor (TFT) having a thin film semiconductor on an insulation substrate to define an element region, and a hygroscopic interlayer insulating layer which covers said element, a hydrogenation treatment which comprises said interlayer insulating layer provided thereon a capping layer for blocking hydrogen diffusion, so that water entrapped by the interlayer insulating layer may be decomposed to generate hydrogen which is allowed to diffuse into the thin film transistor provided on the side opposite to that of the capping layer.

12 Claims, 18 Drawing Sheets

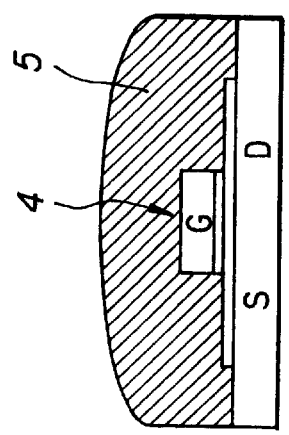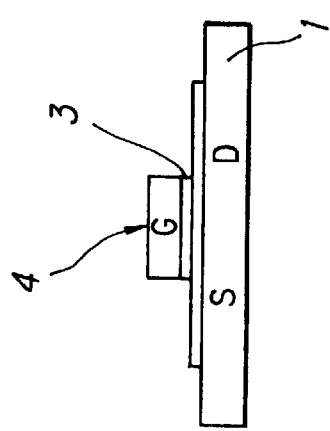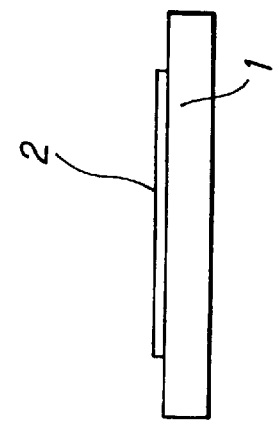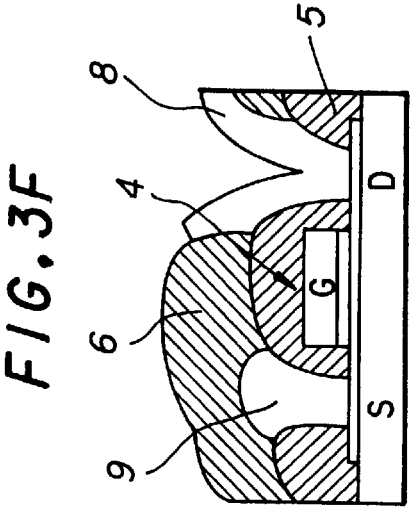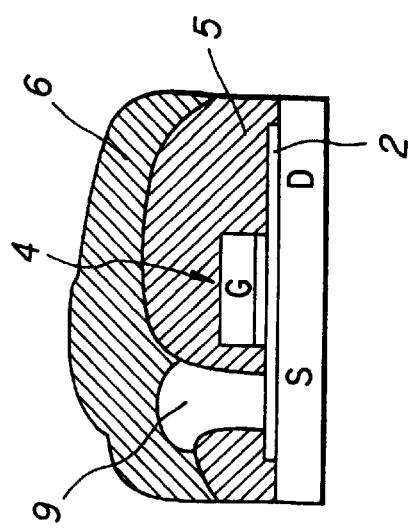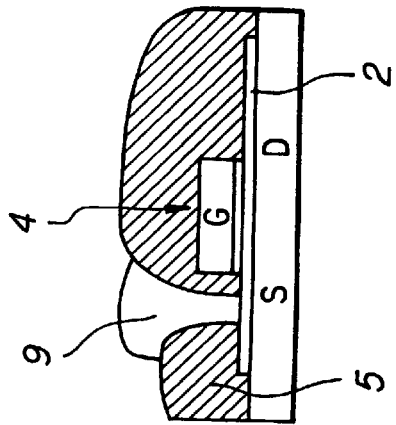

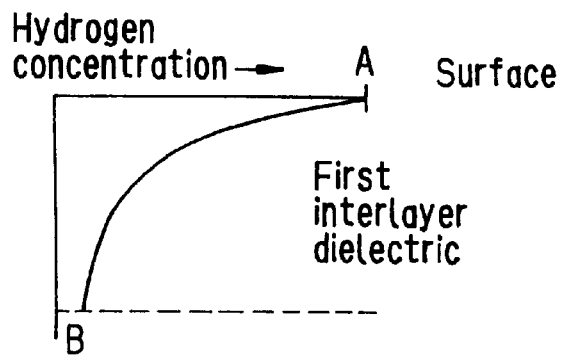
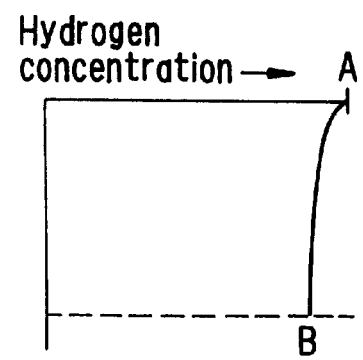
FIG. 12A (Before annealing) / FIG. 12B (After annealing)
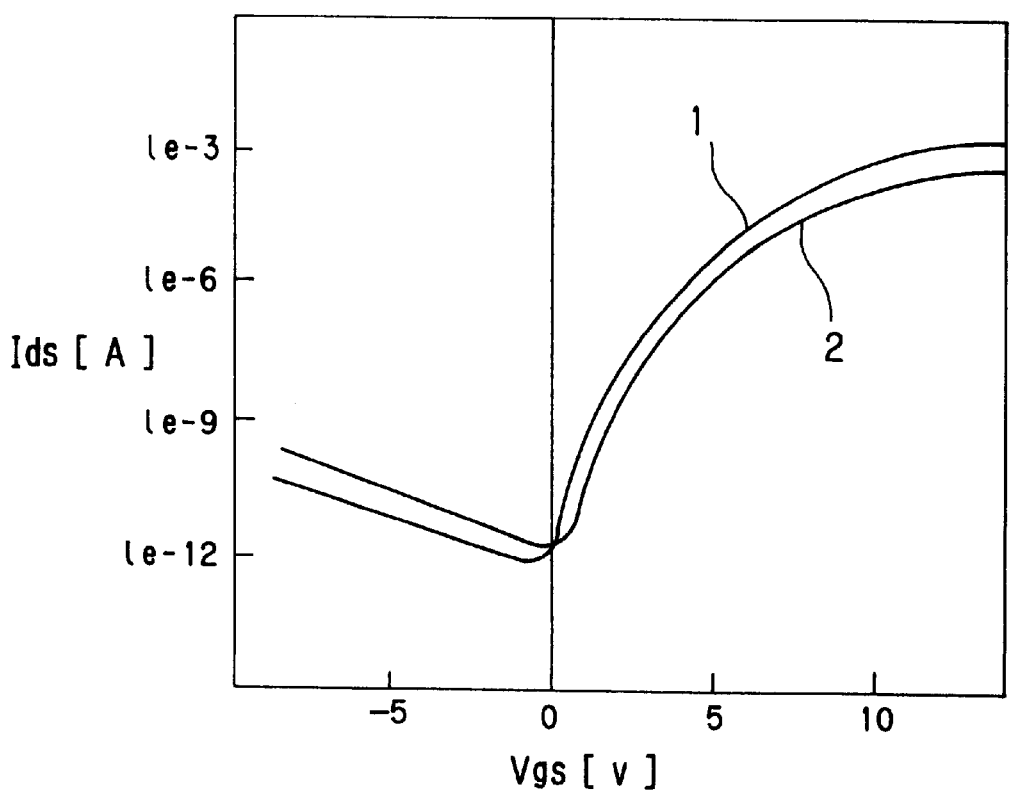
FIG. 13

THIN FILM SEMICONDUCTOR DEVICE FOR ACTIVE MATRIX PANEL

BACKGROUND OF THE INVENTION

The present invention relates to a thin film semiconductor device comprising a thin film transistor formed on an insulation substrate and having a polycrystalline semiconductor layer to define an active region. More specifically, the present invention relates to the technique of hydrogenation treatment of thin film semiconductors.

Referring to FIG. 17, a process for hydrogenation treatment is described briefly below. As shown in the figure, a thin film of polycrystalline silicon 102 patterned to a predetermined shape is formed on the surface of an insulation substrate 101 to provide an element region. A source region S and a drain region D containing impurities at high concentration are formed in the thin film of polycrystalline silicon 102, and a channel region Ch is incorporated therebetween. A thin film transistor (TFT) is established by forming a gate electrode G on the upper side of the channel region Ch, with a gate oxide film 103 and a gate nitride film 104 interposed therebetween. The resulting TFT is coated with a first interlayer insulating layer 105, and an interconnecting electrode 106 is connected to the source region S via a first contact hole provided in the first interlayer dielectric film. A second interlayer insulating layer 107 is further deposited on the first insulation film 105. A pixel electrode 108 made of a light-transmitting electrically conductive film such as an ITO (indium tin oxide) film is formed on the second interlayer insulating layer 107 by patterning, and is electrically connected with the drain region D of the TFT via a second contact hole. A P-SiN film 109 is formed as an overpassivation film on the surface of the second interlayer insulating layer film 107 by patterning. The P-SiN film 109 is a relatively porous film, and contains hydrogen atoms at a considerable quantity. Accordingly, the P-SiN film serves as a hydrogen supply source. Thus, by depositing a P-SiN film 109 after forming a TFT and annealing it thereafter, the hydrogen atoms are allowed to diffuse into the thin film of polycrystalline silicon 102 through the second interlayer insulating layer film 107, the first interlayer dielectric film 105, the gate oxide film 103, and the like. The hydrogen atoms introduced by the hydrogenation treatment diffuse into the grain boundaries of the thin film of polycrystalline silicon 102 to finally combine with the dangling bonds. Accordingly, the barrier potential is lowered due to the decrease in the density of traps. The carrier mobility inside the polycrystalline silicon TFT is thereby elevated to increase the ON current. The leak current can be suppressed by the decrease in trap levels. Furthermore, the threshold voltage of the transistor can be lowered because a part of the hydrogen atoms diffuses into the grain boundary of the thin film of polycrystalline silicon 102 to combine with the dangling bonds, thereby lowering the barrier potential by decreasing the trap density. Thus, the carrier mobility inside the polycrystalline silicon TFT can be further elevated to increase the ON current. Moreover, the leak current can be controlled by reducing the trap levels. Furthermore, a part of the hydrogen atoms introduced by the treatment also combine with the boundary levels at the boundary between the polycrystalline silicon layer and the gate oxide film to further lower the threshold voltage of the transistor.

In the technique described in the foregoing, the P-SiN film 109 provided as the diffusion source contains hydrogen to a considerable quantity. Accordingly, it may possibly undergo reduction reaction with ITO which constitutes the pixel electrode 108. This requires the part of the P-SiN film in contact with ITO to be removed by photolithography and etching to prevent the reduction reaction from occurring between the P-SiN film and ITO. However, these additional steps for removal consume both time and cost. Moreover, it is difficult to realize TFTs of uniform quality once a part of the P-SiN film is removed, because the hydrogenation efficiency decreases in the part from which the P-SiN is removed. As an alternative means for hydrogenation, a TFT is exposed to hydrogen plasma to incorporate hydrogen into the structure. Similar to the process using a P-SiN film as the hydrogen supply source, this process also requires additional steps, special apparatuses, etc., thereby leading to an increased cost and process time.

SUMMARY OF THE INVENTION

In the light of the aforementioned circumstances, it is an object of the present invention to provide a structure of a thin film semiconductor device designed applicable to an efficient hydrogenation treatment. The object of the present invention is accomplished by a thin film semiconductor device comprising an insulation substrate, a thin film transistor formed on said insulation substrate and having a polycrystalline semiconductor layer to define an active region, a hygroscopic interlayer dielectric film covering said active region, and a capping layer for blocking hydrogen diffusion.

The interlayer insulating layer film according to the present invention is hygroscopic, and is, for instance, a film based on silicon dioxide ($SiO_2$) containing at least one chemical selected from the group consisting of phosphorus, arsenic, lead, antimony, and boron.

The capping layer according to the present invention, for example, contains at least one layer made of aluminum (Al), P-SiN, P-$SiO_2$, P-SiON, titanium (Ti), or tantalum (Ta). Furthermore, a pixel electrode may be formed on the upper side of the interlayer insulating layer film to use the thin film semiconductor device according to the present invention as a driver substrate for display elements.

Preferably, the surface area of the interlayer insulating layer film according to the present invention is increased by roughening the surface. Thus, it can readily absorb water to provide an efficient hydrogen supply source for the element region.

According to another aspect of the present invention, there is provided a process for fabricating a substrate for use in display elements, comprising: a deposition step for depositing a hygroscopic insulating interlayer after forming a thin film transistor, a coating step for depositing a cap film which functions as a hydrogen diffusion blocking film on the interlayer insulating layer film, and a hydrogenation step for hydrogenating the resulting structure for pyrolysing the water entrapped in the interlayer film to generate hydrogen and introducing the resulting hydrogen into said thin film of polycrystalline semiconductor by diffusion. Thus is fabricated a substrate for use in display elements which comprises integrated a thin film transistor having a thin film polycrystalline semiconductor as the element region, a pixel electrode driven by said thin film transistor, and an interconnecting electrode for said thin film transistor.

In the deposition step according to the process of the present invention, for instance, a silicon glass is deposited as the interlayer film. Usable silicon glass includes a PSG (phosphosilicate glass) containing 8% or less phosphorus. In the coating step in the process according to the present invention, for example, a dense electrically conductive film is deposited as the cap film. The conductive film is made of a metallic material which may be selected from the group consisting of, for example, aluminum, titanium, tantalum, molybdenum, chromium, tungsten, and titanium nitride. Otherwise, a metal silicide selected from the group consisting of, for example, aluminum silicide, titanium silicide, molybdenum silicide, chromium silicide, and tungsten silicide may be used as well. Furthermore, a multilayered film comprising two or more layers made from materials selected from, for example, aluminum, titanium, tantalum, molybdenum, chromium, tungsten, aluminum silicide, titanium silicide, molybdenum silicide, chromium silicide, and tungsten silicide, may be used as the conductive film. In this case, the conductive film can be patterned into the interconnecting electrode after the hydrogenation step. It is also possible to additionally effect a step of planarization for forming a planarization film after the step of interconnection, or a step of providing pixels by forming the pixel electrodes on said planarization film.

According to a still other embodiment of the present invention, a dense insulation film may be deposited as the capping layer in the coating step. The insulation film may be selected from those made from, for example, P-SiN, P-SiO, or P-SiON. Said insulation film can be removed after the completion of the hydrogenation step.

The hydrogenation step is preferably effected by applying heat treatment to the structure in the temperature range of from 150 to 500 ° C. Preferably, the duration of heating is in the range of 1 to 15 hours. It is also preferred that the heat treatment is effected under a nitrogen gas or hydrogen gas atmosphere.

The process according to the present invention is characterized in that the interlayer film deposited on the thin film transistor is used as the hydrogen supply source. More specifically, the process comprises depositing a cap film capable of blocking hydrogen diffusion on the interlayer film, and thereafter decomposing water trapped in the interlayer film to generate hydrogen. Hydrogen is then introduced into the polycrystalline semiconductor layer. The capping layer may be, for example, a dense electrically conductive film. The conductor film thus deposited is patterned after the hydrogenation treatment to form an interconnecting electrode, a black mask, etc. Thus, it can be seen that the capping layer is not deposited particularly for the hydrogenation treatment, and that the hydrogenation treatment according to the present invention can be advantageously implemented without incorporating any additional process steps. The capping layer need not necessarily be a conductor film, and a dense insulation film can be used as well. In this case, the insulation film can be left over as it is so that it may be used as the interlayer film. The key in increasing the hydrogenation efficiency in a thin film transistor is to obtain hydrogen in a sufficient quantity. More specifically, a sufficiently large amount of water must be absorbed by the interlayer insulating film. In this context, the interlayer insulating layer deposited on the thin film transistor is subjected to etching treatment and the like to increase the surface area thereof. Thus, the water adsorption power of the interlayer insulating layer can be increased to retain hydrogen in a sufficiently high quantity for hydrogenation.

The process according to the present invention comprises depositing a capping layer which functions as a hydrogen diffusion shield on the surface of a hygroscopic interlayer. Thus, hydrogen is obtained by decomposing the water trapped in the interlayer insulating layer, and is allowed to diffuse into the side opposite to the cap film to effect the hydrogenation of the thin film transistor. The interlayer film and the capping layer utilized in the hydrogenation treatment are fabricated by the steps generally included in an ordinary process for fabricating TFTs. Accordingly, the steps for effecting the hydrogenation treatment need not be especially added to the prior art process steps. This advantageously reduces the fabrication cost and achieves a high throughput. Since the process is effected without using the conventional P-SiN film as the diffusion source, the reduction reaction between a pixel electrode made from ITO and the like can be prevented from occurring. Accordingly, the failure ratio of the products can be considerably improved. Moreover, high performance TFTs of uniform quality can be implemented because hydrogen is introduced from the interlayer insulating layer provided in the vicinity of the thin film polycrystalline semiconductor. Furthermore, another difference from the prior art processes is that the process according to the present invention can be conducted without incorporating any additional steps for the hydrogenation. Thus, a high quality device can be realized by eliminating the damage which the TFT receive during the steps of fabrication.

In addition, the water adsorption power and hence, the amount of hydrogen retained in the interlayer insulating layer can be increased by increasing the surface area of the $SiO_2$ based interlayer insulating layer deposited on the device by, for example, light etching. Water necessary for the hydrogenation can be accumulated not only on the surface but also in the inside of the interlayer insulating layer by adding impurities such as phosphorus, arsenic, lead, antimony, and boron into the film. Furthermore, a film of, for example, P-SiN, P-SiON, aluminum (Al), titanium (Ti), or tantalum (Ta) can be deposited on the surface side of the water-absorbed interlayer insulating layer film to prevent external diffusion of hydrogen from occurring. Thus, hydrogen can be efficiently supplied to the device side on hydrogenation annealing. The hydrogenation efficiency can be improved in this manner, and further effect of increasing the ON current and decreasing the OFF current are obtained for the thin film transistor device.

BRIEF DESCRIPTION OF THE DRAWINGS

FIGS. 3A to 3F is a diagram showing schematically drawn step-sequential cross section structures obtained in a process for fabricating a substrate for a display element according to a second embodiment of the present invention;

FIGS. 12A and 12B is a diagram showing schematically drawn progress in hydrogenation treatment for a thin film semiconductor device illustrated in FIG. 11;

FIG. 13 is a graph showing the Ids (drain current)-Vgs (gate voltage) characteristic curve for a thin film transistor subjected to hydrogenation treatment;

DETAILED DESCRIPTION OF PREFERRED EMBODIMENTS

The present invention is described in further detail below referring to the preferred embodiments according to the present invention with the attached drawings. It should be understood, however, that the present invention is not to be construed as being limited to the examples below.

FIGS. 1A to 1F show schematically drawn step-sequential cross section structures obtained in a process for fabricating a substrate for a display element according to a first embodiment of the present invention.

Figure 1A:
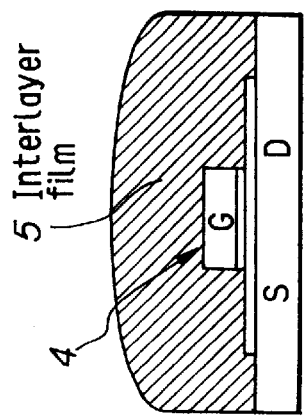
FIGS. 1A to 1F is a diagram showing schematically drawn step-sequential cross section structures obtained in a process for fabricating a substrate for a display element according to a first embodiment of the present invention.
Figure 1B:
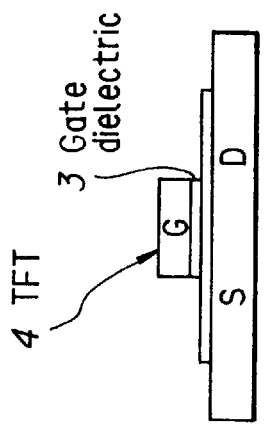

Referring to FIG. 1A, a polycrystalline semiconductor layer 2 is formed globally on the surface of a glass substrate 1 by means of CVD or the like. In the present case, polycrystalline silicon (Poly-Si) is deposited to provide the thin film polycrystalline semiconductor. Then referring to FIG. 1B, a gate oxide film 3 is formed on the thin film polycrystalline semiconductor 2 to establish a thin film transistor (TFT) 4 having a gate electrode G therein. The thin film transistor 4 comprises on the both sides of the gate electrode G, a drain region D and a source region S both highly doped with impurities.

Figure 1C:
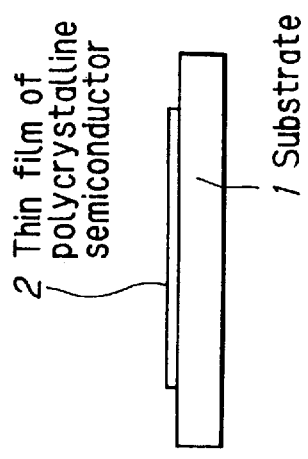

Referring to FIG. 1C, a deposition step comprising depositing a hygroscopic insulating interlayer insulating layer 5 is conducted. The interlayer insulating layer 5 is, for example, a silicon glass film. Preferably, it is a PSG film containing 8 % or less of phosphorus. More specifically, a PSG containing 4 % phosphorus is deposited in the present case. The PSG film is hygroscopic, and is therefore suitable for preserving water therein.

Figure 1D:
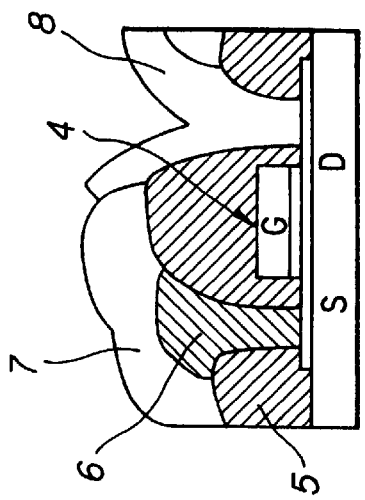

Then referring to FIG. 1D, the interlayer insulating layer 5 is locally etched to perforate a contact hole communicating with the source region S of the TFT 4. Subsequently, a coating step is conducted to deposit a capping layer 6 as a hydrogen diffusion shield on the interlayer capping layer 5. The capping layer 6 is a dense conductor film of, for example, aluminum, titanium, tantalum, and titanium nitride. Aluminum is deposited in the present case for a thickness of 300 nm or more to impart a sufficiently high preventive function against the diffusion of hydrogen. Then, the hydrogenation step is effected. Water trapped in the interlayer insulating layer 5 is decomposed to produce hydrogen. The thus generated hydrogen is allowed to diffuse into the thin film polycrystalline semiconductor 2 located on the side opposite to that of the cap film 6. The structure is heated in the temperature range of from 150 to 500° C. during this step. The decomposition of water does not proceed at a temperature of 150° C. or lower. On the contrary, the capping layer 6 undergoes melting or the interlayer insulating layer made of PSG and the like is densified if the temperature should be maintained at a temperature as high as 500° C. or even higher. Accordingly, a heating temperature of 300° C. is selected in the present case. The heat treatment is preferably continued for a duration of about 1 to 15 hours. The characteristics of a TFT can be further improved with increasing duration of heat treatment. However, a heat treatment of 15 hours or longer adversely impacts impairs the throughput. On the contrary, too short a heat treatment with a duration of within 1 hour is found to sometimes result in an insufficiently effected hydrogenation. Thus, the heat treatment is effected for a duration of about 3 hours in the present case. The heat treatment is preferably effected under an atmosphere containing gaseous nitrogen or gaseous hydrogen. It is believed that the hydrogenation occurs by the heat treatment according to the following process; i.e., water contained in the interlayer insulating layer 5 is decomposed, and the resulting hydrogen alone is allowed to diffuse into the thin film polycrystalline semiconductor 2. Since the surface of the device is covered with a cap film 6, the outward dissipation of hydrogen can be prevented from occurring.

Figure 1E:
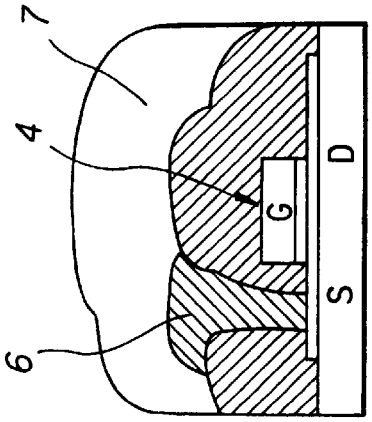

Referring then to FIG. 1E, the cap film 6 is patterned to give an interconnecting electrode corresponding to the source region S of the TFT 4. After this step of interconnection, another interlayer insulating layer 7 is further deposited thereon.

Figure 1F:
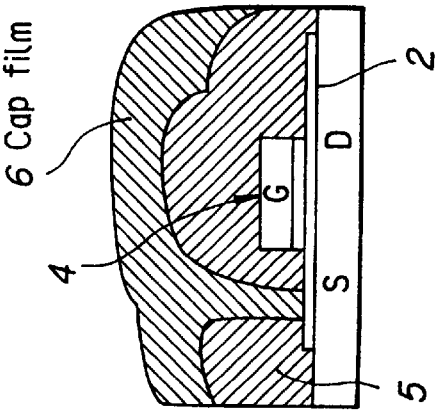

Finally, referring to FIG. 1F, the interlayer insulating layer 5 and 7 are locally etched to provide a contact hole communicating to the drain region D of the TFT 4. A complete substrate for display elements is implemented by finally effecting the pixel step for forming a pixel electrode 9 on the interlayer insulating layer 7.

The effect of the process for fabricating a semiconductor device according to the present invention on the shortening of process steps was evaluated by measuring the running time. The duration of the entire process from the input of a glass substrate 1 to the completion of a substrate for display elements was found to be shortened to yield an average of 14 days. Moreover, the CVD process step and the like can be eliminated from the process according to the present embodiment, because the conventional P-SiN films, etc., that were used as a diffusion source can be excluded. Thus, the entire cost of fabrication was reduced to about 95% of the cost required for a prior art process. Furthermore, the substrate for display elements thus obtained was assembled into an active matrix display element. The percentage defective for the pixels was found to be extremely low; it was 1.0 ppm or less in average. This achievement is believed ascribable to the effective hydrogenation which causes less damage to the substrate.

A comparable substrate for display elements was fabricated according to a prior art process. Thus, a P-SiN film as a hydrogen diffusion source was deposited and was subjected to photolithography and etching before effecting the hydrogenation treatment. A complete substrate for display element was obtained only after 18 days in average from the point a glass substrate was charged. The substrate for display elements thus obtained was assembled into an active matrix display element. The percentage defective for the pixels was found by inspection to be as high as 2.5 ppm in average, and the running cost was also found to increase.

Figure 2A:
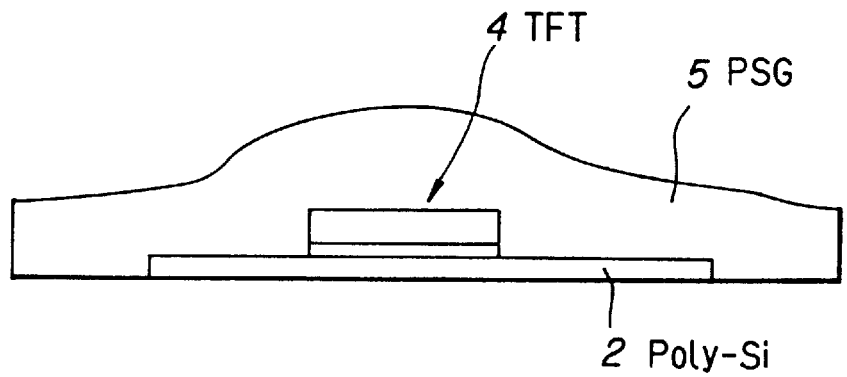
FIGS. 2A to 2C is an explanatory diagram showing in detail the step-sequential cross section structures during a hydrogenation step according to a first embodiment of the present invention.
Figure 2B:
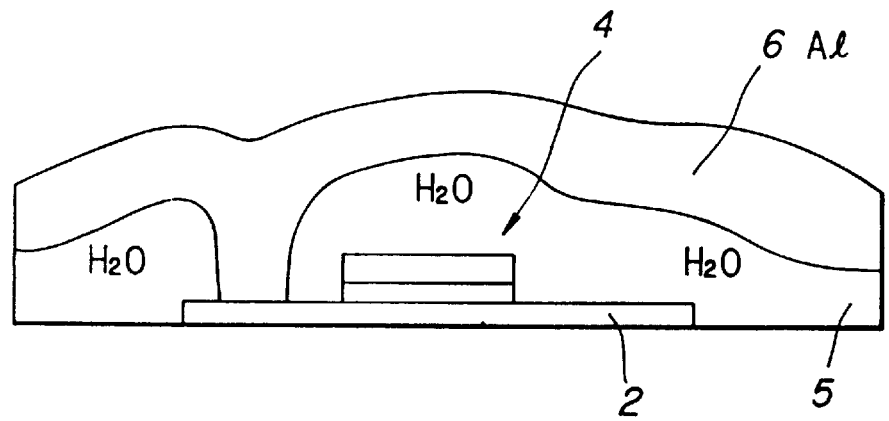
Figure 2C:
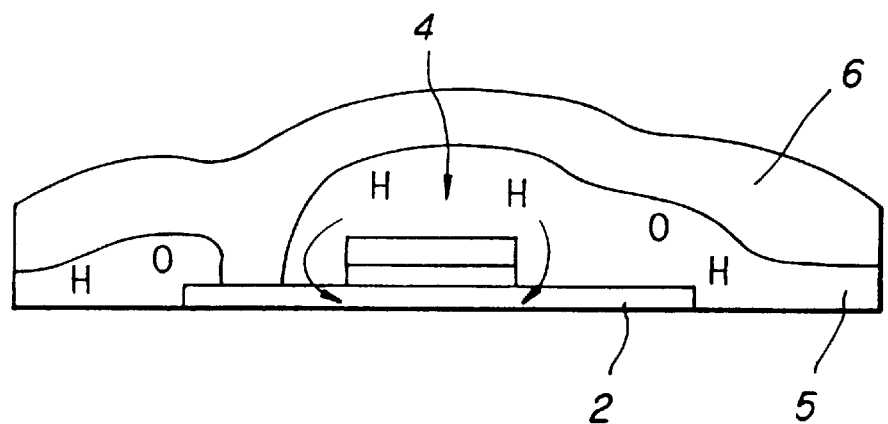

FIGS. 2A to 2C is an explanatory diagram showing in detail the step-sequential cross section structures of the essential part during a hydrogenation step according to an embodiment of the present invention.

Referring to FIG. 2A, a PSG film is deposited as an interlayer insulating layer 5 after fabricating a TFT 4.

Referring then to FIG. 2B, aluminum is vapor-deposited on the interlayer insulating layer 5 as a capping layer 6. Water intrudes into the interlayer insulating layer 5 when the structure is left to stand still before effecting the vapor deposition, or when the structure is subjected to a pretreatment before effecting the vapor deposition. Water can be preserved in a sufficient amount by using a highly hygroscopic PSG as the interlayer insulating layer 5.

Finally referring to FIG. 2C, water is decomposed into hydrogen and oxygen during the vapor deposition of the capping layer 6 or the annealing effected thereafter. Hydrogen obtained as the decomposition product diffuses into the thin film polycrystalline semiconductor 2 made of polycrystalline silicon. The hygroscopic power of the PSG intensifies and hence becomes more advantageous for hydrogenation with increasing concentration of phosphorus. However, phosphorus atoms that are present in an exceedingly high concentration over 8% reversely hinders the progress of hydrogenation. It is believed that the phosphorus atoms present in excess inhibit the diffusion transportation of pyrolytic hydrogen. Conclusively, the phosphorus concentration in a PSG interlayer dielectric must be maintained in an optimal range.

Referring to FIGS. 3A to 3F, the process for fabricating a substrate for display elements according to a second embodiment of the present invention is described in detail below.

As shown in FIGS. 3A and 3B, a step of fabricating a semiconductor device which comprises forming a thin film transistor 4 on a substrate 1 is effected at first. This step is the same as that illustrated in FIGS. 1A and 1B.

Referring to FIG. 3C thereafter, a deposition step for depositing a hygroscopic insulation film as an interlayer insulating layer 5 is conducted. This step is also the same as that shown in FIG. 1C.

Referring to FIG. 3D, the PSG interlayer insulating layer 5 is locally etched to perforate a contact hole communicating with the source region S of the TFT 4. Subsequently, a film of a conductor such as aluminum is deposited and patterned to form an interconnecting electrode 9.

As shown in FIG. 3E, a coating step is conducted to deposit a capping layer 6 as a hydrogen diffusion shield on the interlayer insulating layer 5. The capping layer 6 is a dense insulation film in this case. The insulation film is selected from those made from, for example, P-SiN, P-SiO, or P-SiON. A P-SiN film is used as the insulation film in the present case. P-SiN is deposited as the capping layer 6 in the present case for a thickness of 100 nm or more to impart a sufficiently high preventive function against the diffusion of hydrogen. Then, the hydrogenation step is effected. Water trapped in the interlayer insulating layer 5 is heated and decomposed to produce hydrogen. The thus generated hydrogen is allowed to diffuse into the thin film polycrystalline semiconductor 2 located on the side opposite to that of the cap film 6. The heat treatment in the present example is effected at 300° C. for a duration of 3 hours or longer.

Finally, referring to FIG. 3F, the capping layer 6 and the base interlayer insulating layer 5 are locally etched to provide a contact hole communicating to the drain region D of the TFT 4. A complete substrate for display elements is implemented by depositing a clear conductive film such as an ITO film and forming a pixel electrode 8 by patterning the deposited clear conductive film.

An average of 18 days was necessary from the input of a glass substrate 1 to the completion of a substrate for display elements. The throughput of this process is increased as compared with that described in the first embodiment above referring to FIGS. 1A to 1F. This is due to the incorporation of an additional step for depositing an insulation film for the capping layer in the place of a conductive film for use in interconnecting electrodes. An active matrix liquid crystal display device was assembled using the substrate for display elements thus obtained according to the embodiment with reference to FIGS. 3A to 3F. The percentage defective for the pixels was found by inspection to be as low as 1.3 ppm in average. Thus, a sufficiently high hydrogenation efficiency was realized. In the embodiment according to FIGS. 3A to 3F, the capping layer 6 is left as it is to utilize it as an interlayer insulating layer between the interconnecting electrode 9 and the pixel electrode 8. However, the present invention is not only limited to this embodiment, and the capping layer 6 can be removed after using it in the hydrogenation treatment. Then, another interlayer insulating layer which exhibits excellent properties upon etching may be deposited in the place of the capping layer. The perforation of an opening for the contact to the drain region D of the TFT 4 can be facilitated in this manner.

Referring to FIGS. 4A to 4G, the process for fabricating a substrate for display elements according to a third embodiment of the present invention is described in detail below. The present embodiment is a combination of a hydrogenation step using a hygroscopic interlayer insulating layer and a planarization step.

Figure 4A:
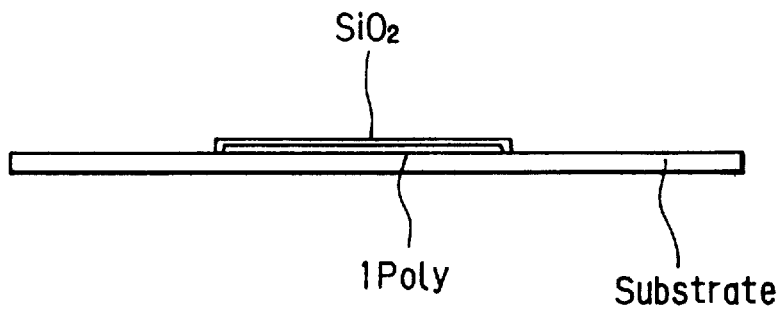
FIGS. 4A to 4C is a diagram showing schematically drawn step-sequential cross section structures obtained in a process for fabricating a substrate for a display element according to a third embodiment of the present invention.

Referring first to FIG. 4A, a first polycrystalline silicon layer (1Poly) is deposited by means of LPCVD on the surface of an insulation substrate made of quartz and the like. After once finely dividing 1Poly by implanting silicon ions, solid phase growth process is effected to obtain a coarse-grained 1Poly. The 1Poly thus obtained is patterned into a predetermined shape to provide an element region. Then, the surface of 1Poly is thermally oxidized to provide a $SiO_2$ gate oxide film. The threshold voltage is controlled beforehand by implanting boron ions at a predetermined concentration.

Figure 4B:
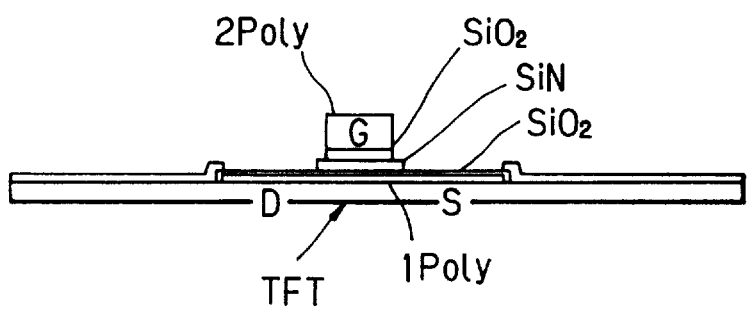

In the step illustrated in FIG. 4B, SiN is deposited by LPCVD process to provide a gate nitride film. The surface of the SiN film is thermally oxidized to convert the surface into $SiO_2$. Thus is obtained a three-layered $SiO_2/SiN/SiO_2$ gate insulation film having an excellent withstand voltage. A second polycrystalline silicon layer (2Poly) is deposited thereafter by LPCVD process. After lowering the resistance, 2Poly is patterned to a predetermined shape to obtain a gate electrode G. A source region S and a drain region D are provided in 1Poly by implanting arsenic ions at a high concentration. Thus is obtained an N-channel TFT.

Figure 4C:
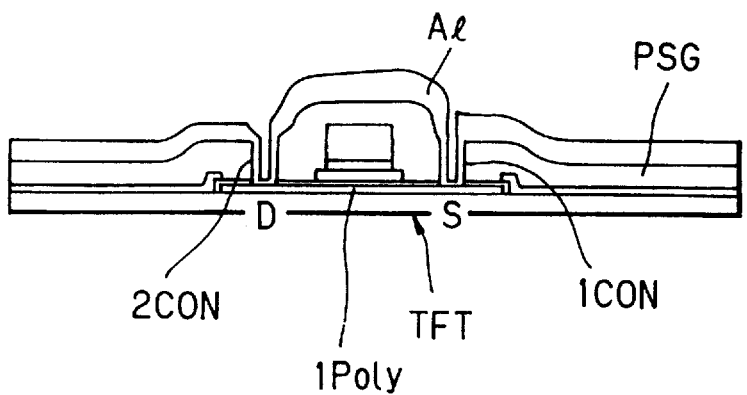

In the subsequent step illustrated in FIG. 4C, an interlayer insulating layer (PSG) is deposited by APCVD process. After perforating a first contact hole (1CON) and a second contact hole (2CON) in the PSG, an aluminum film (Al) is deposited over the entire surface of the structure. The resulting structure is subjected to heat treatment (annealing) to heat and decompose water trapped in PSG. Thus, hydrogenation step is effected by allowing the hydrogen atoms generated in the decomposition to diffuse into 1Poly while using an aluminum cap film deposited by sputtering.

Referring to FIG. 4D, the aluminum film is patterned into a predetermined shape to provide an interconnecting electrode electrically connected to the source region S of the TFT.

In the subsequent step illustrated in FIG. 4E, the surface irregularities on the PSG is buried by the planarization film. Thus, a liquid acrylic resin having a predetermined viscosity was applied to the surface of PSG by spin coating. The acrylic resin is subjected to heat treatment thereafter to obtain a set film as the planarization film. An opening matched to 2CON is formed by applying photolithography and etching to the set planarized film. The drain region D of the TFT is exposed in the bottom of the 2CON.

Referring to FIG. 4F, a clear conductive film is deposited by sputtering. An ITO film is used as the clear conductive film in the present case. The inside of 2CON is also filled by ITO to electrically connect 2CON with the drain region D of the TFT. Finally referring to FIG. 4G, the ITO film is patterned into a predetermined shape to provide a pixel electrode. Thus is completed a planarized substrate for display elements. The substrate for display elements thus obtained is used, for example, in the assembly of an active matrix liquid crystal display. In this specific case, a facing substrate having thereon a facing electrode is joined with the substrate for display elements obtained above with a predetermined distance taken therebetween. After the assembly step above, liquid crystal is sealed in the space defined by the two substrates to obtain a complete an active matrix liquid crystal display element. In the step of the present embodiment as shown in FIG. 4C, 1CON communicated to the source region S and 2CON communicated to the drain region D can be perforated simultaneously by etching PSG. Thus, the fabrication process can be simplified as compared with prior art processes. Furthermore, the surface irregularities is buried by utilizing a planarization film to remove the surface steps. Accordingly, by applying the substrate of the present embodiment to a liquid crystal display element, a uniform pre-tilt angle can be obtained on liquid crystal molecules, and a high display quality can be realized by suppressing the formation of reverse tilt domain.

Figure 5:
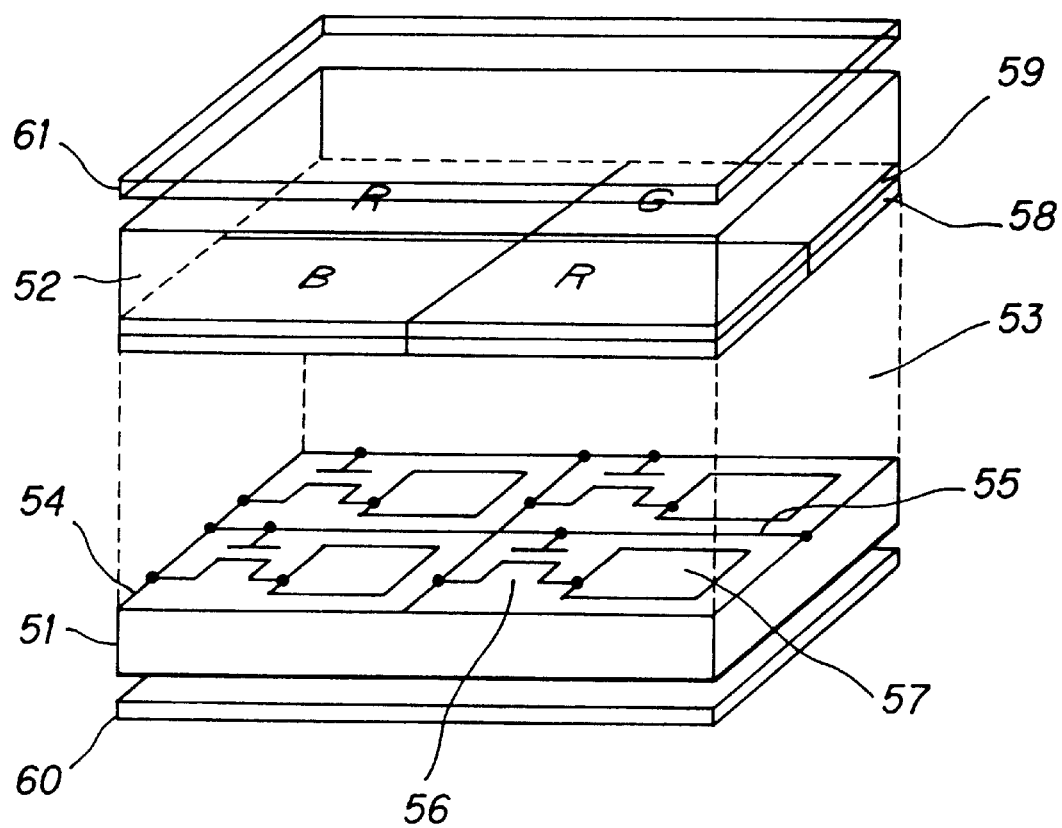
FIG. 5 is an exploded perspective view of an active matrix-addressed liquid crystal display device assembled by utilizing a substrate for displays fabricated according to the present invention.

Referring to FIG. 5, an example of an active matrix liquid crystal display device obtained by assembling a substrate for display elements fabricated according to the present invention is described below. As shown in the figure, the present liquid crystal display element comprises a pair of glass substrates 51 and 52 faced to each other, and a liquid crystal layer 53 enclosed between the substrates. One of the glass substrates 51 is processed according to the present invention. Thus, the glass substrate 51 has thereon signal lines 54 and scanning lines 55 arranged into a matrix, TFTs 56 and pixel electrodes 57 placed on the crossings of the signal lines and the scanning lines. The TFTs 56 herein are previously subjected to hydrogenation treatment according to the present invention. The TFTs 56 are active switching elements which are line-sequentially selected by the scanning lines 55, and which write the image signal supplied by the signal lines 54 into the corresponding pixel electrodes 57. On the other hand, facing electrodes 58 and a color filter film 59 are formed on the inner surface of the upper glass substrate 52. The color filter film 59 is divided into segments R (red), G (green), and B (blue) corresponding to each of the pixel electrodes 57. The active matrix liquid crystal display element of this structure is sandwiched by two polarized sheets 60 and 61 to provide a full-color image display as desired by using a white incident light.

FIGS. 6A to 6F show schematically drawn step-sequential cross section structures obtained in a process for fabricating a substrate for a display element according to a fourth embodiment of the present invention.

Figure 6A:
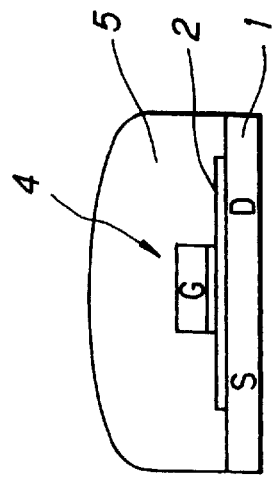
FIGS. 6A to 6F is a diagram showing schematically drawn step-sequential cross section structures obtained in a process for fabricating a substrate for a display element according to a fourth embodiment of the present invention.

Referring first to FIG. 6A, a polycrystalline semiconductor layer 2 is formed globally on the surface of a glass substrate 1 by means of CVD or the like. In the present case, polycrystalline silicon (Poly-Si) is deposited to provide the thin film polycrystalline semiconductor.

Figure 6B:
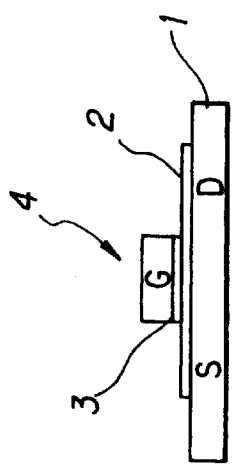

Then referring to FIG. 6B, a gate oxide film 3 is formed on the thin film polycrystalline semiconductor 2 to establish a thin film transistor (TFT) 4 having a gate electrode G therein. The thin film transistor 4 comprises on the both sides of the gate electrode G, a drain region D and a source region S both highly doped with impurities.

Figure 6C:
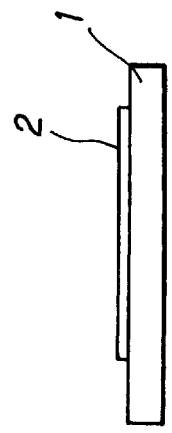

Referring to FIG. 6C, a hygroscopic insulating interlayer insulating layer 5 is deposited. The interlayer insulating layer 5 in this embodiment is a PSG film containing 4% phosphorus. The PSG film is hygroscopic, and is therefore suitable for preserving water therein.

Figure 6D:
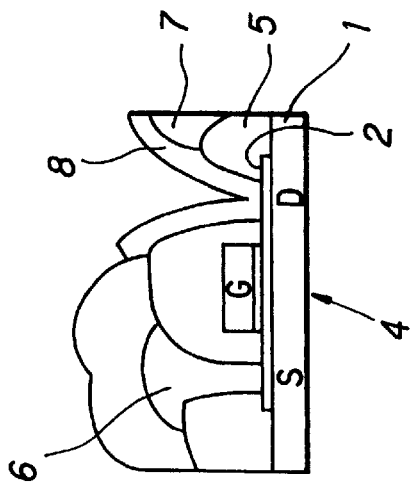
Figure 6E:
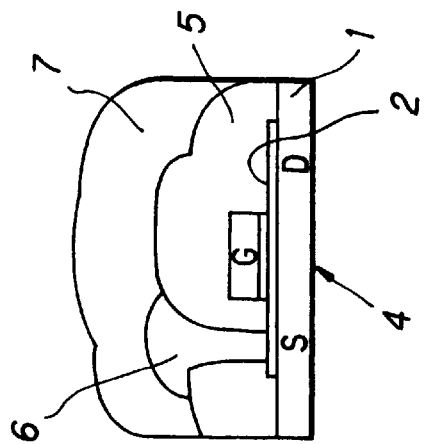
Figure 6F:
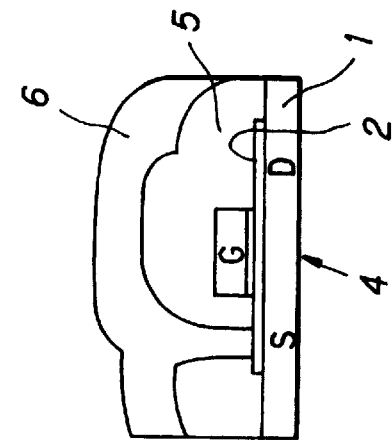

Then referring to FIG. 6D, the interlayer insulating layer 5 is locally etched to perforate a contact hole communicating with the source region S of the TFT 4. Subsequently, a capping film 6 made of molybdenum as a hydrogen diffusion shield is deposited on the interlayer insulating layer 5. The capping layer 6 is a dense conductor film deposited at a thickness of 300 nm or more to impart a sufficiently high preventive function against the diffusion of hydrogen. In addition to molybdenum, the capping layer 6 may be made of a metal interconnection material, for example, titanium, chromium, and tungsten. Otherwise, it may be selected from metal silicides such as aluminum silicide, titanium silicide, molybdenum silicide, chromium silicide, and tungsten silicide. Then, the water trapped in the interlayer dielectric 5 is decomposed to produce hydrogen. The thus generated hydrogen is allowed to diffuse into the thin film polycrystalline semiconductor 2 located on the side opposite to that of the capping layer 6. The structure is heated at a temperature at about which PSG would not be densified and at which molybdenum does not melt. Thus, for example, the heat treatment is effected at 300° C. The characteristics of a TFT can be improved further with increasing duration of heat treatment. Considering the throughput, however, a duration of 3 hour or longer is preferred for the heat treatment. The heat treatment is preferably effected under an atmosphere containing gaseous nitrogen or gaseous hydrogen. It is believed that the hydrogenation occurs by the heat treatment according to the following process; i.e., water contained in the interlayer insulating layer 5 is decomposed, and the resulting hydrogen alone is allowed to diffuse into the thin film polycrystalline semiconductor 2. Since the surface of the device is covered with a capping layer 6, the outward dissipation of hydrogen can be prevented from occurring. Referring then to FIG. 6E, the molybdenum cap film 6 is patterned to give an interconnecting electrode to the source region S of the TFT 4. After this step of forming the interconnection, another interlayer insulating layer 7 is deposited thereon. Finally, referring to FIG. 6F, the interlayer insulating layer 5 and 7 are locally etched to provide a contact hole communicating with the drain region D of the TFT 4. A complete substrate for display elements is implemented by finally forming a pixel electrode 8 made of ITO and the like on the interlayer insulating layer 7.

The effect of the process for fabricating a semiconductor device according to the present invention on the shortening of process steps was evaluated by measuring the running time. The time necessary for the entire process from the input of a glass substrate 1 to the completion of a substrate for display elements was found to be shortened to yield an average of 14 days. Moreover, the CVD process step and the like can be eliminated from the process according to the present embodiment, because the conventional P-SiN films, etc., that were used as a diffusion source can be excluded. Thus, the entire cost of fabrication was reduced to about 95% of the cost required for a prior art process. Furthermore, the substrate for display elements thus obtained was assembled into an active matrix display element. The percentage defective for the pixels was found to be extremely low as to yield 1.0 ppm or less in average. This achievement is believed ascribable to the effective hydrogenation which causes less damage to the substrate.

Referring to FIGS. 7A to 7F, a process for fabricating a substrate for displays according to a fifth embodiment of the present invention is described below. This process is basically the same as that of the fourth embodiment with reference to FIG. 8. Accordingly, the corresponding portions are referred to with the same reference numbers to make it more readily understood.

Figure 7A:
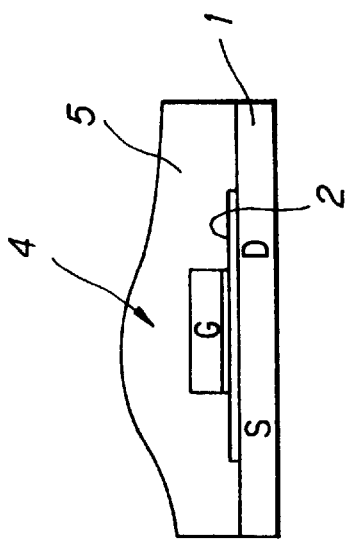
FIGS. 7A to 7F is a diagram showing schematically drawn step-sequential cross section structures obtained in a process for fabricating a substrate for a display element according to a fifth embodiment of the present invention.
Figure 7B:
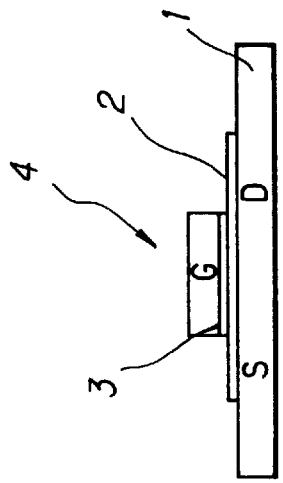

As shown in FIGS. 7A and 7B, a step of fabricating a semiconductor device which comprises forming a thin film transistor 4 on a substrate 1 is effected at first. This step is similar to that illustrated in FIGS. 6A and 6B.

Figure 7C:
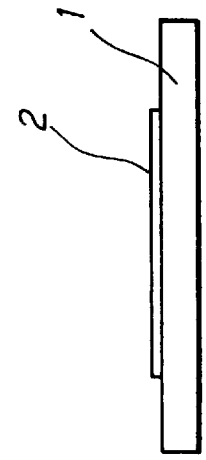
Figure 7D:
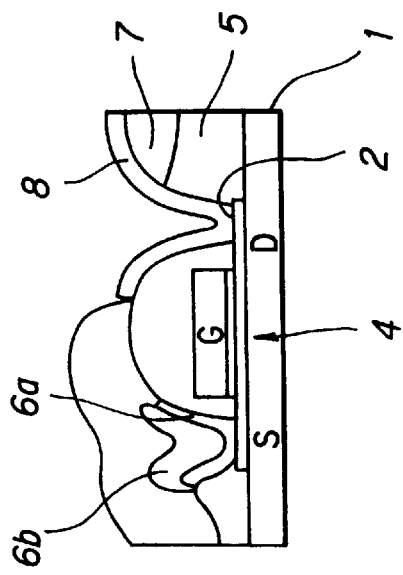

Referring to FIG. 7C, a deposition step for depositing a hygroscopic insulation film as an interlayer insulating layer 5 is conducted. A non-doped silicon glass (NSG) is used as the interlayer insulating layer 5 in the present embodiment. After allowing NSG to sufficiently absorb water, it is locally etched to perforate a contact hole communicating with the source region S of the TFT 4. Subsequently, a titanium first cap film 6a and further thereon an aluminum second capping layer 6b are deposited continuously to provide a double-layered metallic film. The resulting structure is subjected to heat treatment at 400° C. thereafter to allow the hydrogen atoms entrapped in the interlayer insulating layer 5 to diffuse into the thin film polycrystalline semiconductor 2. The first cap film 6a functions as the barrier metal layer during the heat treatment to prevent spikes from generating between aluminum and Poly-Si. Thus, the titanium film is preferably provided at a thickness of 100 nm or less.

Figure 7E:
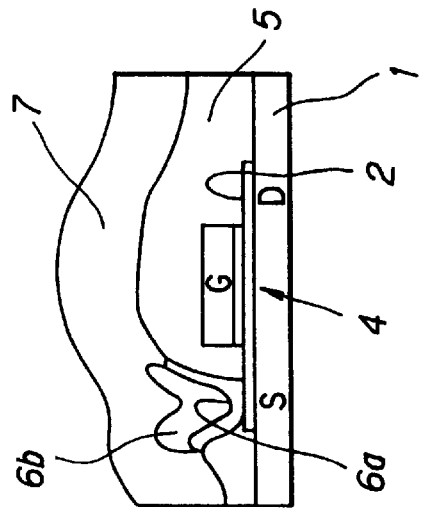
Figure 7F:
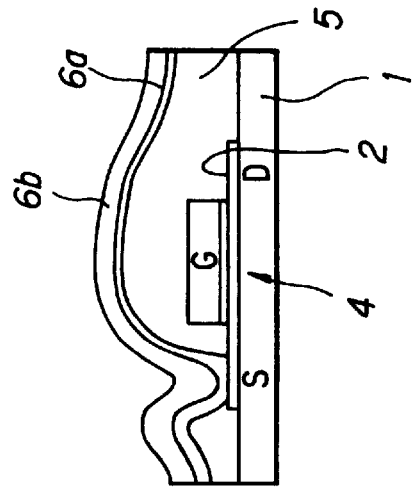

Referring to FIG. 7E, the two-layer structured capping layer is patterned after the hydrogenation treatment to provide an interconnecting electrode. Another interlayer insulating layer 7 is deposited on the resulting structure. Finally, a substrate for display elements is completed by forming a pixel electrode 8. Titanium and aluminum is used for the two-layer structured capping layer in the present embodiment, however, the present invention is not only limited thereto. In general, the capping layer can be provided using a multilayered film comprising two layers or more each made of materials selected from aluminum, titanium, molybdenum, chromium, tungsten, aluminum silicide, titanium silicide, molybdenum silicide, chromium silicide, and tungsten silicide.

The effect of the process for fabricating a semiconductor device according to the present invention on the shortening of process steps was evaluated by measuring the running time. The time necessary for the entire process from the input of a glass substrate 1 to the completion of a substrate for display elements was found to be shortened to yield an average of 15 days. The hydrogenation was found to proceed further as compared with the case according to the fourth embodiment because the temperature of heat treatment was elevated in the present process. Accordingly, when the substrate for display elements thus obtained was assembled into an active matrix display element, the percentage defective for the pixels was found to be suppressed to an extremely low value of 0.8 ppm or less in average.

Figure 8:
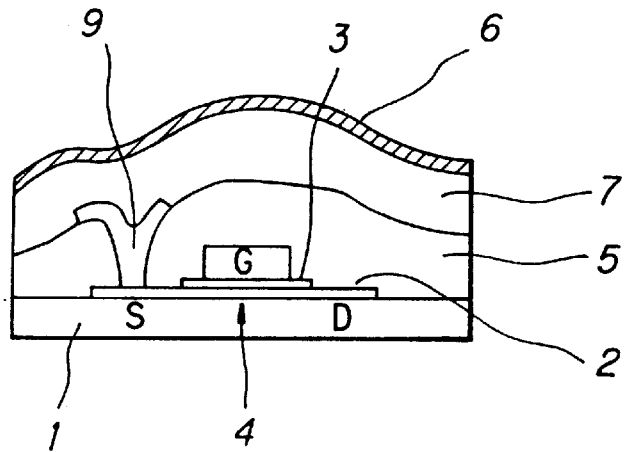
FIG. 8 is a schematically drawn cross section view of a substrate for displays according to another embodiment of the present invention.

FIG. 8 is a schematically drawn cross section view of a substrate for displays according to another embodiment of the present invention. As is shown in the figure, a thin film transistor 4 is formed on a glass substrate 1. In the present embodiment, the thin film transistor 4 is covered by a first interlayer insulating layer 5 and a second interlayer insulating layer 7. An interconnecting electrode 9 communicating with the source region S of the thin film transistor 4 is interposed between the both interlayer insulating layer 5 and 7. A cap film 6 capable of blocking hydrogen diffusion is deposited on the two layers of interlayer insulating layer 5 and 7. Hydrogen is introduced into the polycrystalline semiconductor layer 2 by applying heat treatment to the resulting structure. If at least either of the interlayer insulating layer 5 and 7 is sufficiently hygroscopic, an effective hydrogenation treatment can be effected according to the process of the present invention. Not all of the layered interlayer insulating layer need be hygroscopic.

Figure 9:
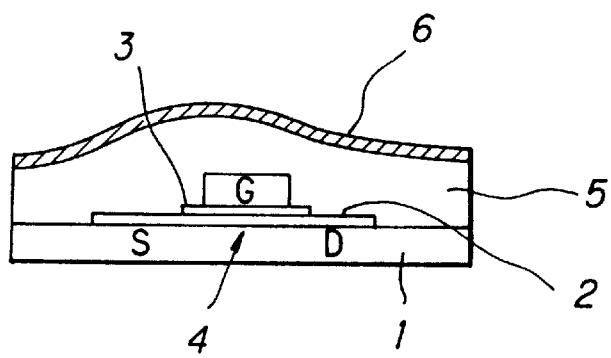
FIG. 9 is a schematically drawn cross section view of a substrate for displays according to a still other embodiment of the present invention.

FIG. 9 is a schematically drawn cross section view of a substrate for displays according to a still other embodiment of the present invention. In the foregoing first to fifth embodiments, the hydrogenation treatment is effected after a contact hole is provided to the structure. However, the present invention is not only limited to the foregoing embodiments, and the hydrogenation treatment can be effected after depositing a capping layer 6 without opening a contact hole as is shown in the present embodiment. In the present case, for instance, a dense insulation film can be used as the cap film 6. Then, a contact hole can be provided in the interlayer insulating layer 5 either with the capping layer 6 still remaining in the structure or removed.

Figure 10:
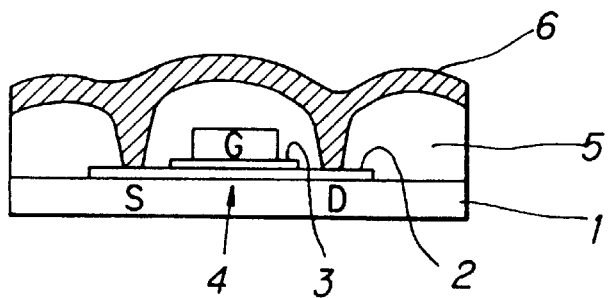
FIG. 10 is a schematically drawn cross section view of a substrate for displays according to a further other embodiment of the present invention.

FIG. 10 is a schematically drawn cross section view of a substrate for displays according to a further other embodiment of the present invention. As is shown in the figure, hydrogenation treatment is effected after opening an contact hole which communicates with both of the source region S and the drain region D of the thin film transistor 4, and depositing a capping layer 6 made of a dense conductor material.

Figure 11:
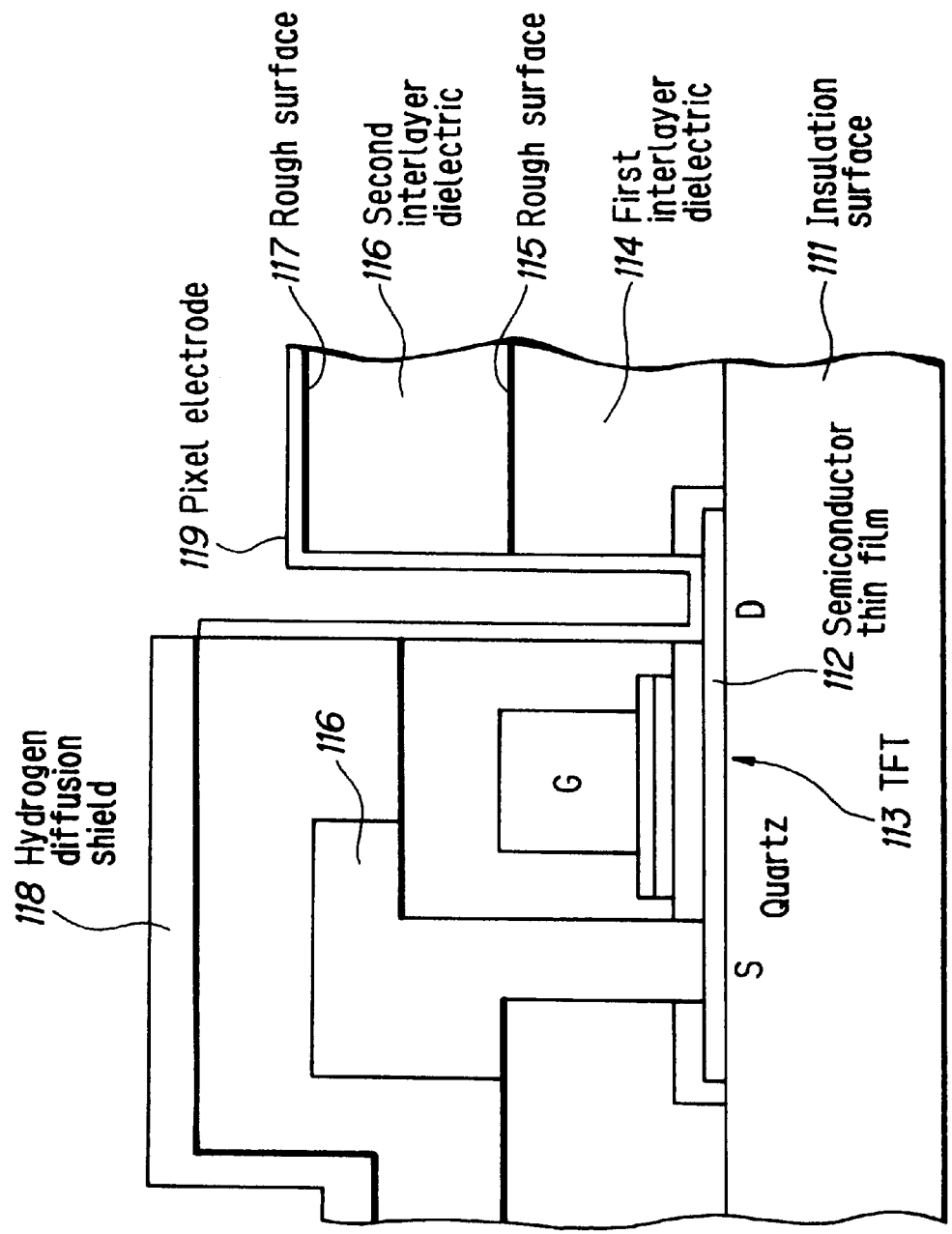
FIG. 11 is a schematically drawn cross section view of a part of a thin film semiconductor device according to a sixth embodiment of the present invention.

A process according to a sixth embodiment of the present invention is described below. FIG. 11 is a partial cross section view of a substrate for displays according to the sixth embodiment of the present invention. As is shown in the figure, a thin film semiconductor 2 comprising polycrystalline silicon (Poly-Si) is formed by patterning into a predetermined shape to give an element region on an insulation substrate 111 made of quartz (Quartz) and the like. A thin film transistor (TFT) 3 is formed in the element region. More specifically, a gate electrode G is formed on the thin film transistor 112 with a three-layered gate dielectric incorporated therebetween. Furthermore, the thin film transistor 4 comprises on the both sides of the gate electrode G, a drain region D and a source region S both highly doped with impurities.

The surface of the TFT 113 of the structure above is covered by a first interlayer insulating layer 4. The surface 115 of the first interlayer insulating layer 114 is roughened to increase the area thereof. Thus, in this manner, the adsorption of water to the thin film semiconductor is enhanced to provide an efficient hydrogen diffusion source. Moreover, the first interlayer insulating layer 114 itself has a predetermined hygroscopicity, and is capable of accumulating water to a certain extent therein.

An interconnecting electrode 116 patterned into a predetermined shape is formed on the first interlayer insulating layer 114, and is connected to the source region S of the TFT 113 via a contact hole provided in the first interlayer insulating layer 114. A second interlayer insulating layer 116 is deposited on the interconnecting electrode 116. Similar to the first interlayer insulating layer 114, the second interlayer insulating layer 116 also is hygroscopic and has a rough surface 117.

A hydrogen diffusion shield 118 is deposited on the second interlayer insulating layer 116 to prevent hydrogen from being diffused to the exterior. In addition, a pixel electrode 119 is formed on the upper side of the second interlayer insulating layer 116, and is connected to the drain region D of the TFT 3 via a contact hole. The thin film semiconductor device of this type can be used, for example, as a driver substrate for an active matrix liquid crystal display element.

Referring to FIGS. 12A and 12B, a process of hydrogenation treatment for a thin film semiconductor device having the structure illustrated in FIG. 11 is described below. A desired hydrogenation treatment can be effected by, for instance, effecting annealing after forming a hydrogen diffusion shield, because hydrogen atoms incorporated in the first interlayer insulating layer 114 and the second interlayer insulating layer 116 diffuse into the thin film semiconductor 112 constituting the element region.

FIG. 12A shows the distribution of hydrogen concentration along the thickness direction of the first interlayer insulating layer before annealing. The figure reads that the hydrogen concentration in the first interlayer insulating layer before annealing is larger for a portion nearer to the surface. FIG. 12B shows the distribution of hydrogen concentration along the depth direction of the first interlayer insulating layer after annealing. It can be seen that a considerably amount of hydrogen is introduced as the heat treatment is applied to move the hydrogen atoms that are initially present in the first interlayer insulating layer into the boundary between the thin film semiconductor (poly-Si). The inward diffusion of hydrogen can thus facilitated by setting the depth profile in the interlayer dielectric before annealing in such a manner that the surface side be higher than the transistor channel side.

FIG. 13 is a graph showing the drain current (Ids)-gate voltage (Vgs) characteristics observed on a thin film transistor after subjecting the device to hydrogenation treatment. The sample used herein was an N-channel thin film transistor having a channel width of 20 µm and a channel length of 5 µm. The curve indicated with numeral 1 shows the drain current-gate voltage characteristics for a case comprising an interlayer insulating layer having a rough surface, and that indicated with numeral 2 shows the same for a case comprising an interlayer insulating layer not having a rough surface. It can be seen clearly from the graph that the hydrogenation efficiency is improved by roughening the surface of the interlayer insulating layer which functions as the hydrogen diffusion source, and that the OFF current (leak current) can be decreased while increasing the ON current.

Figure 14A:
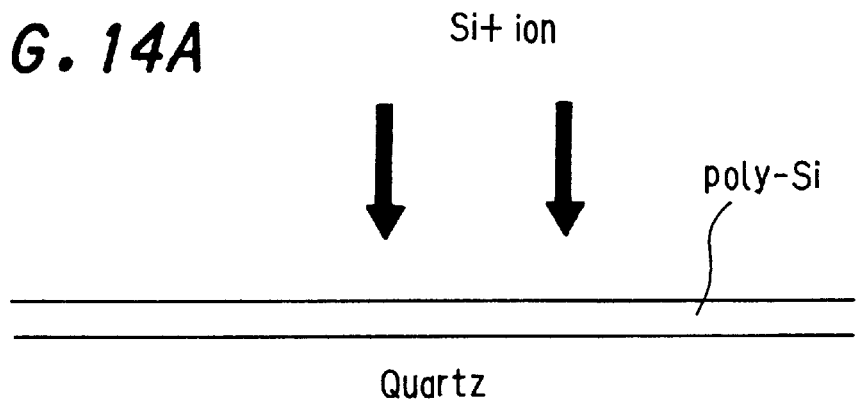
FIGS. 14A to 14G is a diagram showing schematically drawn step-sequential cross section structures obtained in a process for fabricating a substrate for a display element according to a sixth embodiment of the present invention.

Referring to FIGS. 14A to 14G, a process for fabricating a thin film semiconductor device according to a sixth embodiment of the present invention is described below. Referring first to FIG. 14A, a first polycrystalline silicon layer, for example, poly-Si, is deposited to a thickness of about 30 nm by means of LPCVD on the surface of an insulation substrate made of quartz (Quartz) and the like. If necessary, poly-Si is first rendered amorphous by implanting silicon ions ($Si^+$), and annealed thereafter to obtain a coarse-grained poly-Si.

Figure 14B:
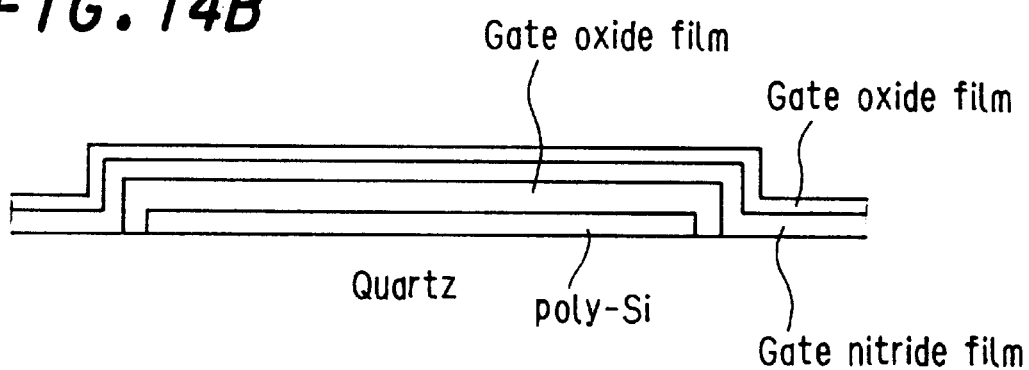

In the step illustrated in FIG. 14B, the poly-Si thus obtained is etched in accordance with a predetermined pattern to provide an element region. Then, the surface of poly-Si is oxidized to provide a gate oxide film at a thickness of about 60 nm. A gate nitride ($Si_3N_4$) film about 50 nm in thickness is further deposited on the gate oxide film by means of LPCVD process. The surface of the gate nitride film is thermally oxidized to form another gate oxide film at a thickness of about 1 to 2 nm. A three-layered gate dielectric is formed in this manner. In case of controlling the threshold voltage Vth of the thin film transistor, if necessary, boron ions ($B^+$) are implanted at a dose of about $1 \times 10^{12}$ to $8 \times 10^{12}/cm^2$.

Figure 14C:
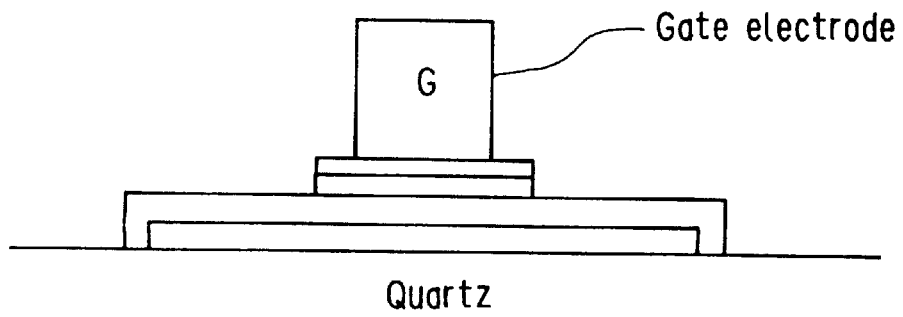

In the step illustrated in FIG. 14C, a layer of polycrystalline silicon is formed to a thickness of about 300 nm. The polycrystalline silicon layer is doped with phosphorus to lower the resistance thereof. Then, the polycrystalline silicon layer is etched to a predetermined shape to form a gate electrode G. The gate dielectric is also etched.

Figure 14D:
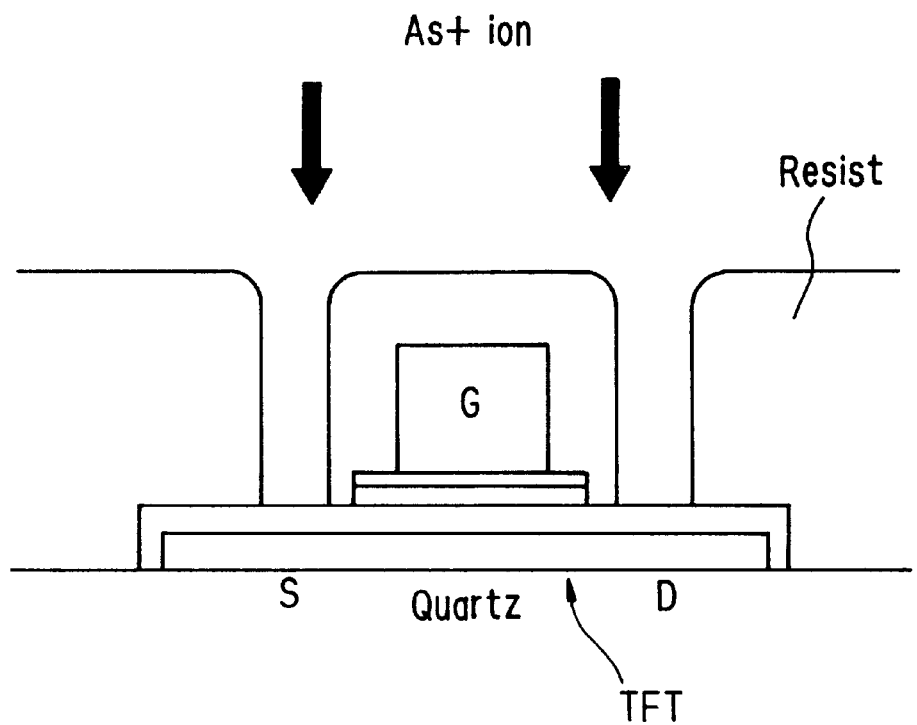

Referring to FIG. 14D, the portion except for the gate electrode G is subjected to ion implantation to introduce arsenic ions ($As^+$) at a dose of from $2 \times 10^{14}$ to $10 \times 10^{14}/cm^2$ to form the source region S and the drain region D for the thin film transistor TFT. Prior to the ion implantation, a resist is formed with a predetermined shape by patterning. After the ion implantation, the structure is annealed under nitrogen atmosphere at a temperature of about 1,000° C. to activate the source region S and the drain region D.

Figure 14E:
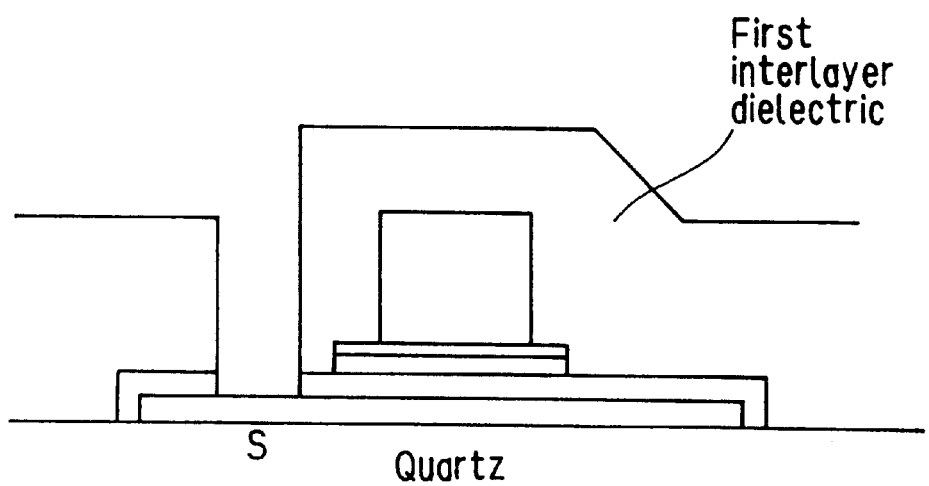

Referring to FIG. 14E, an $SiO_2$ based first interlayer insulating layer is formed at a thickness of about 500 nm to provide a protective and insulating film for the TFT. If necessary, phosphorus, arsenic, lead, antimony, boron, etc., is added into the $SiO_2$ based first interlayer insulating layer. The amount of adsorbed water increases with increasing content of those impurities. Specifically in this embodiment, 5% by weight of phosphorus is added into the $SiO_2$ layer. A contact hole communicating with the source region S is perforated in the first interlayer insulating layer.

Figure 14F:
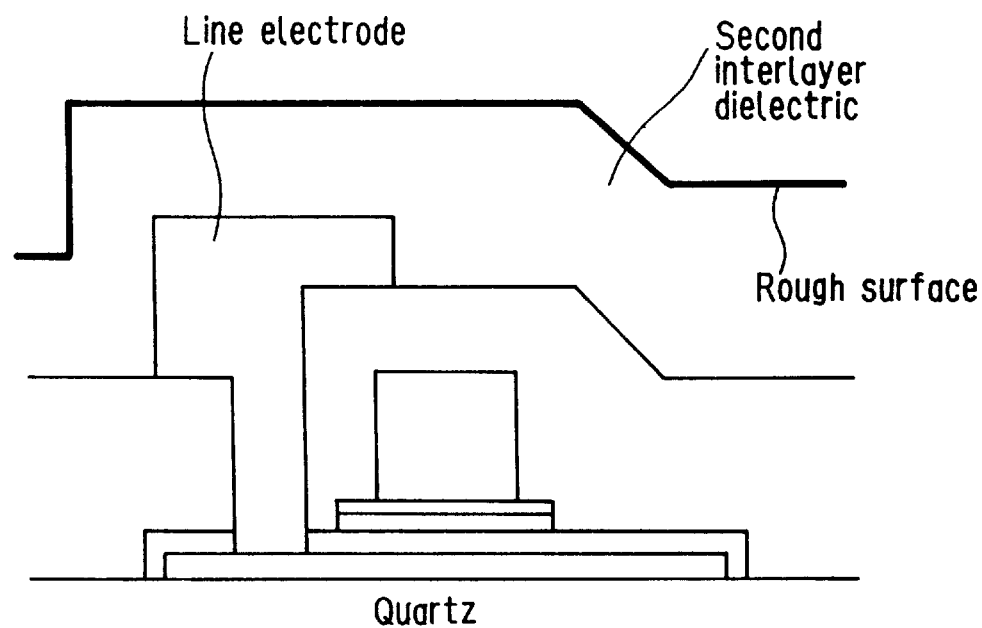

Referring to FIG. 14F, a film of a metal such as aluminum is deposited at a thickness of about 300 nm. The metallic film is patterned into a predetermined shape to obtain an interconnecting electrode. Then, an $SiO_2$ based second interlayer insulating layer is formed at a thickness of about 500 nm to isolate and insulate the interconnecting electrode. If necessary, phosphorus, arsenic, lead, antimony, boron, etc., is added into the SiO$_2$ based second interlayer insulating layer. The amount of phosphorus to be incorporated in the SiO$_2$ second interlayer insulating layer is in the range of from 0 to 3% by weight. Then, the surface of the second interlayer insulating layer is lightly etched to about 5% or less with respect to the film thickness. This treatment allows the second interlayer insulating layer film to efficiently take in water necessary for the hydrogenation. A hydrofluoric acid base solution, for example, can be used as the etchant for the etching. More specifically, a diluted solution of hydrofluoric acid is used for the light etching in the present embodiment. Alternatively, the surface area of the second interlayer insulating layer can be increased to increase the amount of water adsorbed to the surface of the second interlayer insulating layer, by previously subjecting the second interlayer insulating layer to patterning to form irregularities there on.

Figure 14G:
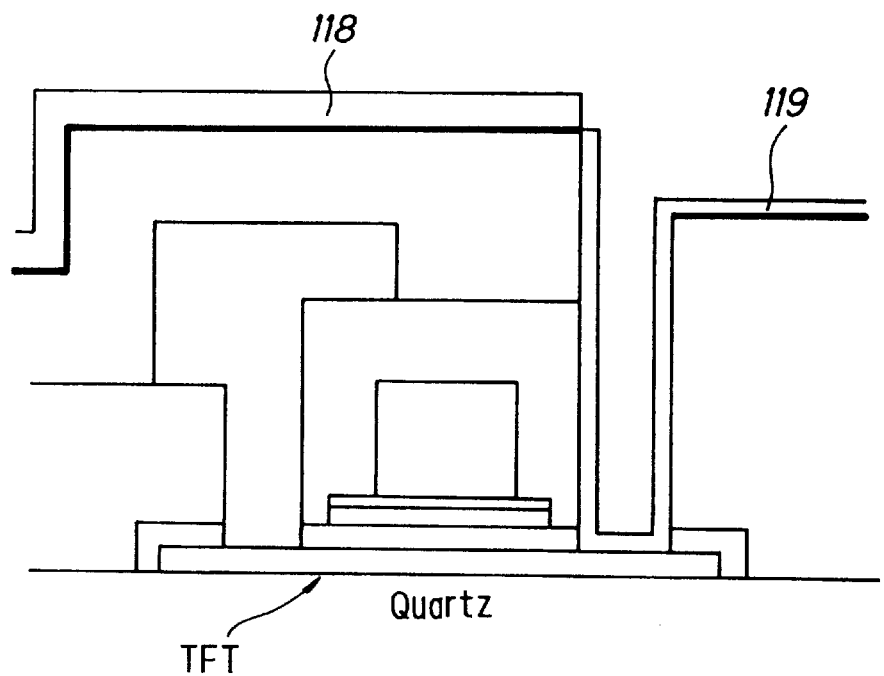

Referring to FIG. 14G, a plasma-deposited film such as a P-SiN, a P-SiO$_2$, or a P-SiON film, or a metallic film 118 such as of aluminum, titanium, and tantalum is deposited to prevent outward diffusion of hydrogen from occurring. More specifically, a plasma-deposited silicon nitride film (P-SiN$_X$) is formed on the second interlayer insulating layer at a thickness of about 50 nm. The hydrogen diffusion shield thus obtained is subjected to etching to remove the contact portion while leaving out at least an area larger than the TFT. The hydrogenation is accelerated by annealing the resulting structure at a temperature range of from 200 to 500° C. under a nitrogen atmosphere. A contact hole is opened thereafter, and a thin film ITO is formed at a thickness of about 100 nm. The structure is completed into a thin film transistor device by patterning the thin film ITO into a predetermined shape and providing a pixel electrode 119 thereon.

Figure 15A:
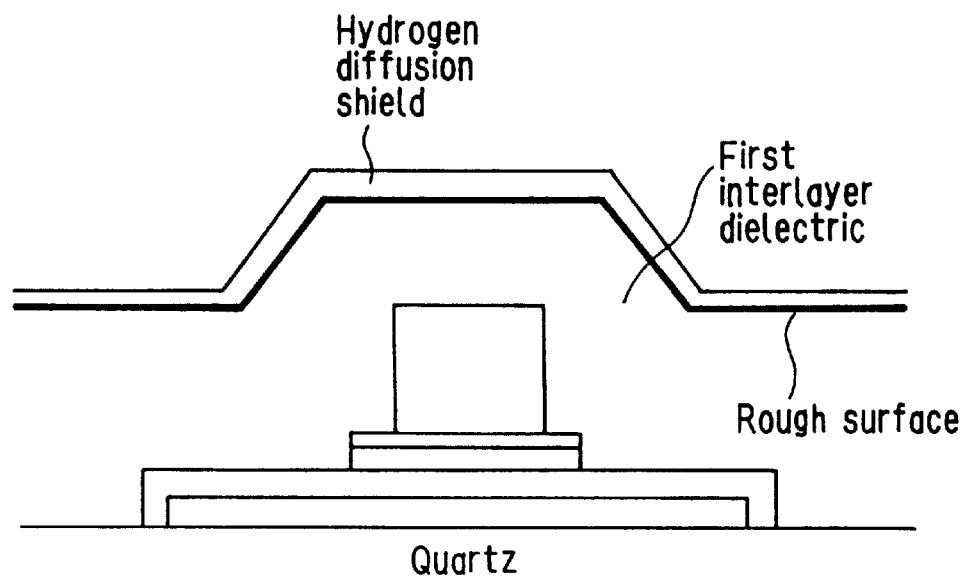
FIGS. 15A to 15C is a diagram showing schematically drawn step-sequential cross section structures obtained in a process for fabricating a substrate for a display element according to a seventh embodiment of the present invention.
Figure 15B:
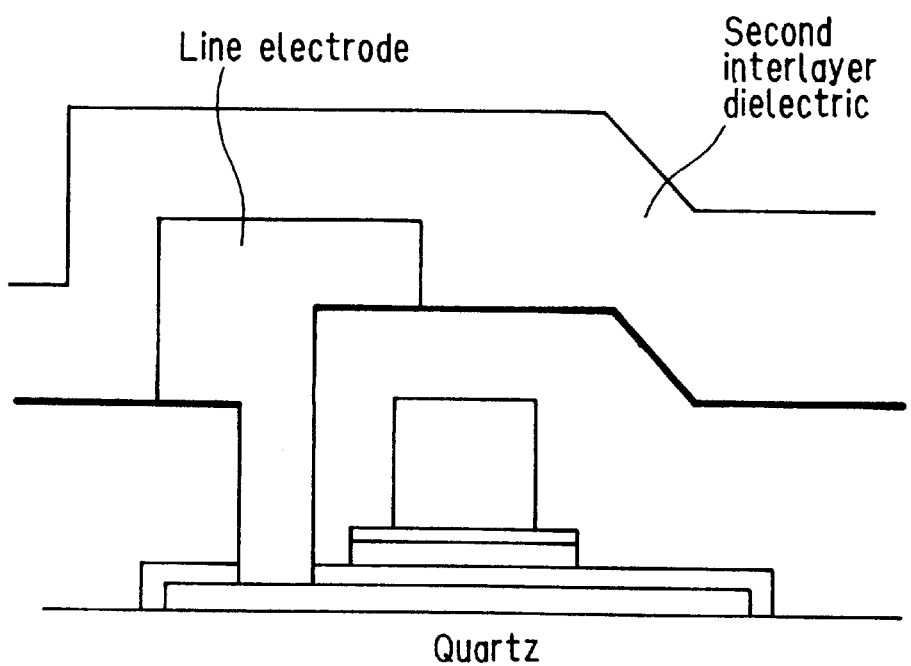
Figure 15C:
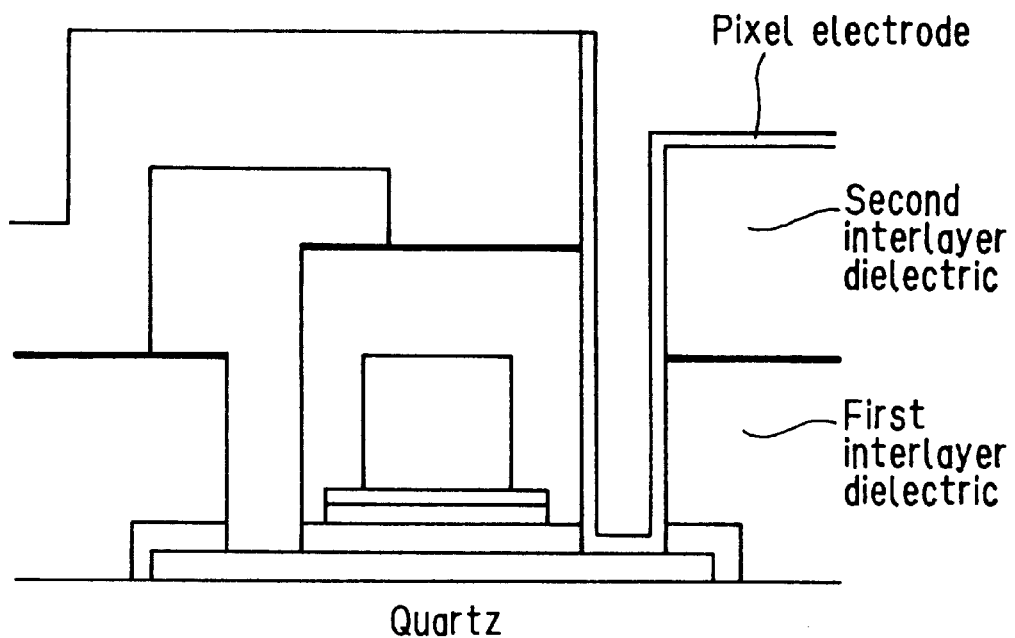

Referring to FIGS. 15A to 15C, a process for fabricating a thin film semiconductor device according to a seventh embodiment of the present invention is described below. The steps up to the one illustrated in FIG. 14C of the foregoing sixth embodiment are effected in the same manner. More briefly, the steps of forming a gate electrode and cutting the gate dielectric are the same for the both processes according to the sixth and the seventh embodiment of the present invention. An SiO$_2$ based first interlayer insulating layer is deposited in the step subsequent thereto, which is illustrated in FIG. 15A. To efficiently absorb water necessary for the hydrogenation, the surface of the first interlayer insulating layer is lightly etched using, for example, a hydrofluoric acid based solution to provide a rough surface. A thin film of plasma-deposited silicon nitride (P-SiN) is provided as a hydrogen diffusion shield at a thickness of about 50 nm by plasma-assisted CVD. The hydrogenation is accelerated thereafter by annealing the resulting structure in the temperature range of from 250 to 500° C.

Referring to FIG. 15B, the unnecessary portion of the hydrogen diffusion shield is removed by etching. In the present embodiment, the hydrogen diffusion shield is subjected to a global etching. Then, a contact hole is perforated, and an aluminum film is deposited and patterned into a predetermined shape to provide an interconnecting electrode. Furthermore, an SiO$_2$ based second interlayer dielectric is formed for the insulation of the interconnecting electrode.

Referring to FIG. 15C, a contact hole is provided in the first interlayer insulating layer and the second interlayer dielectric to deposit a thin film ITO. The thin film ITO is patterned into a predetermined shape to provide a pixel electrode. Thus is obtained a complete thin film semiconductor device.

Figure 16A:
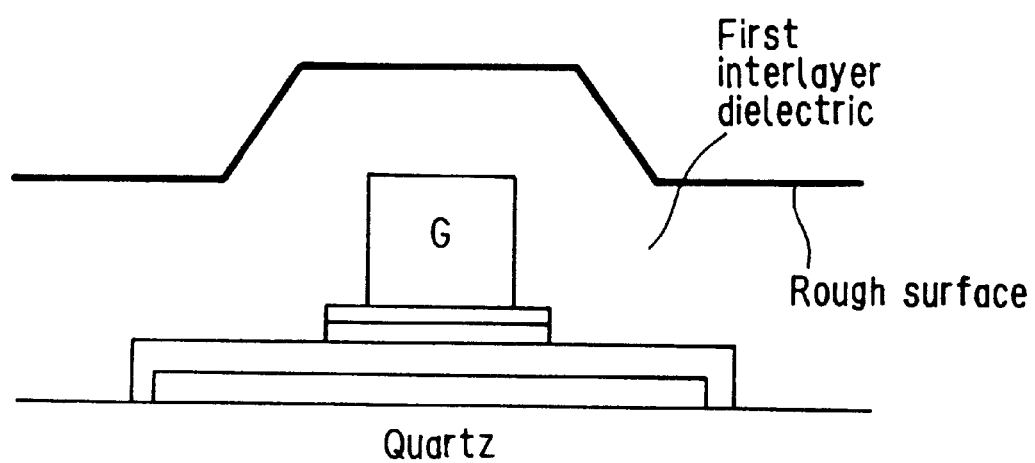
FIGS. 16A to 16D is a diagram showing schematically drawn step-sequential cross section structures obtained in a process for fabricating a substrate for a display element according to an eighth embodiment of the present invention.

Referring to FIGS. 16A to 16D, a process for fabricating a thin film semiconductor device according to a final embodiment, i.e., an eighth embodiment of the present invention is described below. The steps up to the one illustrated in FIG. 14C of the foregoing sixth embodiment are effected in the same manner. More briefly, the steps of forming a gate electrode and cutting the gate dielectric are the same for the both processes according to the sixth and the eighth embodiment of the present invention. A first interlayer insulating layer is deposited in the step subsequent thereto, which is illustrated in FIG. 16A. Subsequently, the surface of the first interlayer insulating layer is lightly etched using, for example, a hydrofluoric acid based solution, to form a rough surface. The formation of a rough surface allows water necessary for the hydrogenation to be absorbed efficiently into the surface and the inside of the first interlayer insulating layer. The water thus absorbed by the first interlayer insulating layer is decomposed to generate hydrogen in the later steps. The decomposition of water is initiated by heating or by applying a plasma. In case of an SiO$_2$ based interlayer insulating layer, for instance, a mechanism of generating hydrogen through the combination of Si and H$_2$O can be assumed. In case a hydrogen diffusion shield is deposited by plasma-assisted CVD or by sputtering, the decomposition of H$_2$O may be accelerated by the energy applied during the process.

Figure 16B:
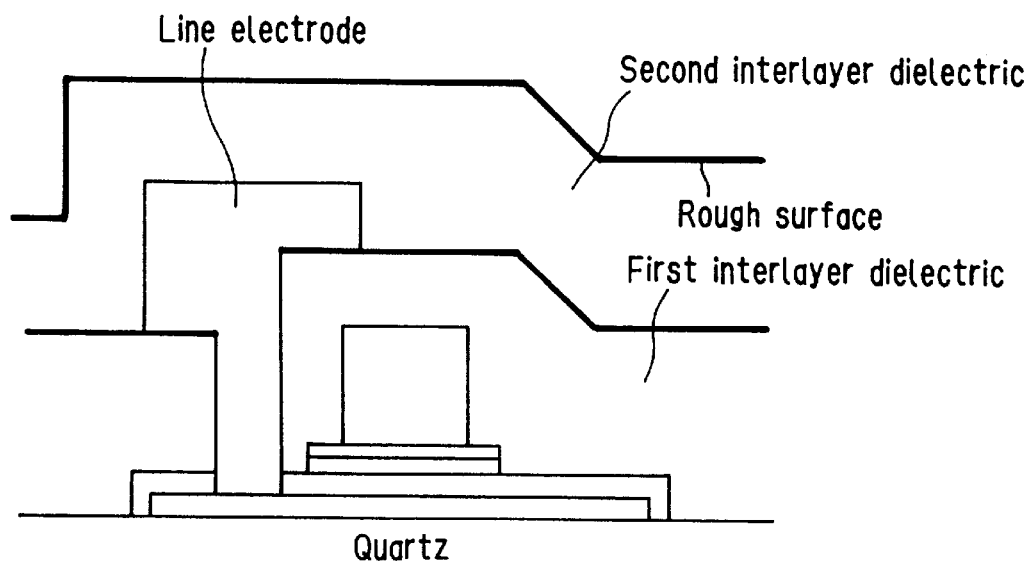

Referring to FIG. 16B, a contact hole is provided in the first interlayer insulating layer and an aluminum film is deposited. The aluminum film thus obtained is patterned into a desired shape to provide an interconnecting electrode. Furthermore, an SiO$_2$ based second interlayer insulating layer is formed for the insulation of the interconnecting electrode.

Figure 16C:
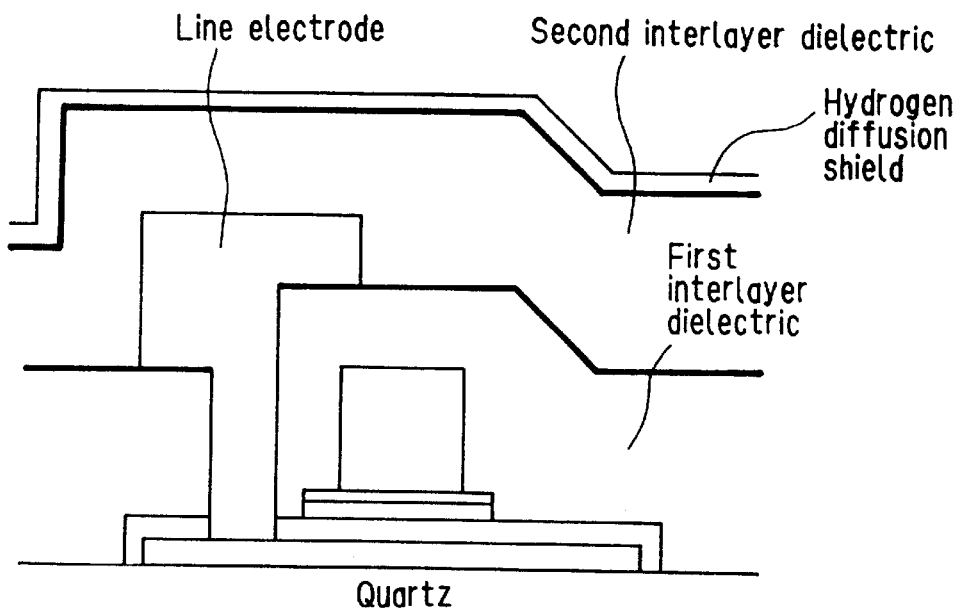

Referring to FIG. 16C, a plasma-deposited silicon nitride film is provided at a thickness of about 50 nm on the second interlayer insulating layer by means of plasma-assisted CVD to form a hydrogen diffusion shield. The resulting structure is subjected to annealing under a nitrogen atmosphere in the temperature range of from 250 to 500° C. for the hydrogenation.

Figure 16D:
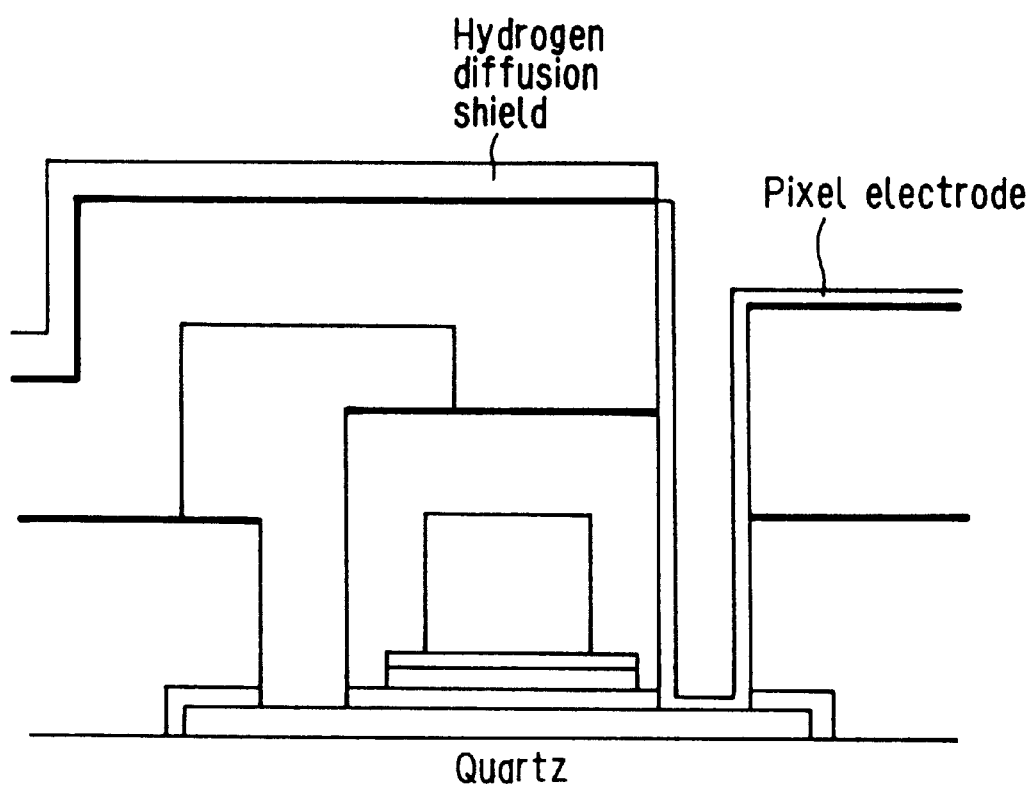
Figure 17:
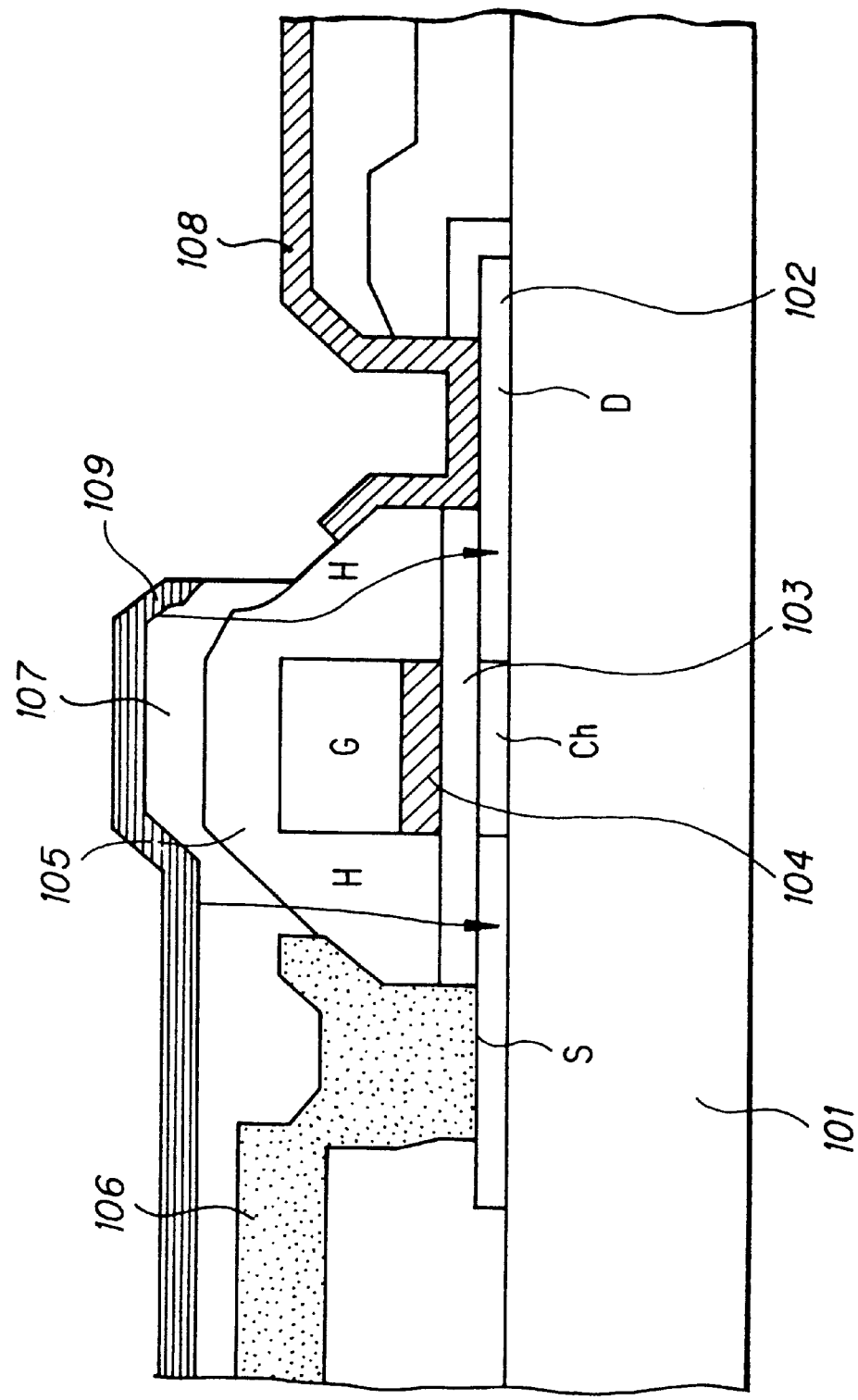
FIG. 17 is an explanatory diagram showing a process of hydrogenation treatment.

Finally, as shown in FIG. 16D, the hydrogen diffusion shield is etched to provide a contact hole therein. A thin film ITO is deposited and patterned into a predetermined shaped to provide a pixel electrode. Thus is obtained a complete thin film semiconductor device.

While the invention has been described in detail and with reference to specific embodiments thereof, it will be apparent to one skilled in the art that various changes and modifications can be made therein without departing from the spirit and scope thereof.

What is claimed is:

1. A thin film semiconductor device comprising: an insulation substrate:

a thin film transistor formed on said insulation substrate and having a polycrystalline semiconductor layer which defines an active region;

a hygroscopic interlayer insulating layer covering said active region; and a cap layer for blocking hydrogen diffusion, which is formed on said interlayer insulating layer.

2. A thin film semiconductor device as claimed in claim 1, wherein, said interlayer insulating layer is comprised of silicon dioxide, and contains at least one chemical selected from the group consisting of phosphorus, arsenic, lead, antimony, and boron.

3. A thin film semiconductor device as claimed in claim 1, wherein, said interlayer insulating layer has a rough surface.

4. A thin film semiconductor device as claimed in claim 1, wherein, said cap layer is a dense insulating film.

5. A thin film semiconductor device as claimed in claim 4, wherein,
said insulating film is a plasma-deposited film.

6. A thin film semiconductor device as claimed in claim 5, wherein,
said plasma-deposited film is selected from the group consisting of P-SiN, P-SiO, and P-SiON films.

7. A thin film semiconductor device as claimed in claim 1, wherein, said cap layer is a dense conductor film.

8. A thin film semiconductor device as claimed in claim 7, wherein,
said conductor film is a film comprising at least one chemical selected from the group consisting of aluminum, titanium, tantalum, molybdenum, chromium, tungsten, and titanium nitride.

9. A thin film semiconductor device as claimed in claim 7, wherein,
said conductor film is a film comprising at least one chemical selected from the group consisting of aluminum silicide, titanium silicide, molybdenum silicide, chromium silicide, and tungsten silicide.

10. A thin film semiconductor device as claimed in claim 7, wherein,
said conductor film is a multilayered film comprising two or more layers made from materials selected from the group consisting of aluminum, titanium, tantalum, molybdenum, chromium, tungsten, aluminum silicide, titanium silicide, molybdenum silicide, chromium silicide, and tungsten silicide.

11. A thin film semiconductor device as claimed in claim 1, which comprises a pixel electrode on an upper side of said interlayer insulating layer, which is used as a driver substrate for display elements.

12. A thin film semiconductor device comprising:
an insulating substrate;
a thin film transistor formed on the insulation substrate having an active region;
a hygroscopic interlayer insulating layer formed on the active region; and a cap layer substantially impermeable to hydrogen formed on the interlayer insulating layer.

* * * * *